United States Patent
Jhan et al.

(10) Patent No.: US 12,490,506 B2
(45) Date of Patent: Dec. 2, 2025

(54) SEMICONDUCTOR DEVICE STRUCTURE WITH AIR GAP AND METHOD FOR FORMING THE SAME

(71) Applicant: Taiwan Semiconductor Manufacturing Company, Ltd., Hsinchu (TW)

(72) Inventors: Yi-Ruei Jhan, Keelung (TW); Kuo-Cheng Chiang, Zhubei (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 636 days.

(21) Appl. No.: 17/826,604

(22) Filed: May 27, 2022

(65) Prior Publication Data

US 2023/0387117 A1  Nov. 30, 2023

(51) Int. Cl.
*H10D 84/85* (2025.01)
*H01L 21/02* (2006.01)
*H01L 21/764* (2006.01)
*H10D 30/01* (2025.01)
*H10D 30/43* (2025.01)
*H10D 30/67* (2025.01)
(Continued)

(52) U.S. Cl.
CPC ....... *H10D 84/85* (2025.01); *H01L 21/02603* (2013.01); *H01L 21/764* (2013.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 84/0167* (2025.01); *H10D 84/0188* (2025.01); *H10D 84/038* (2025.01)

(58) Field of Classification Search
CPC ...... H10D 84/85; H10D 30/014; H10D 30/43; H10D 62/121; H10D 84/0167; H10D 84/0188; H10D 84/0158; H10D 30/024; H01L 21/02603; H01L 21/764; H01L 21/76224
See application file for complete search history.

(56) References Cited

U.S. PATENT DOCUMENTS 9,209,247 B2  12/2015 Colinge et al.
9,236,267 B2  1/2016 De et al.
(Continued)

*Primary Examiner* — Yara B Green
*Assistant Examiner* — Akhee Sarker-Nag
(74) *Attorney, Agent, or Firm* — Birch, Stewart, Kolasch & Birch, LLP

(57) ABSTRACT

A method for forming a semiconductor device structure is provided. The method includes providing a substrate having a base, a first fin, and a second fin over the base. The method includes forming a first nanostructure stack and a second nanostructure stack over the first fin and the second fin respectively. The method includes forming an isolation layer over the base. The method includes forming an isolation structure between the first fin and the second fin and between the first nanostructure stack and the second nanostructure stack. The isolation structure has an air gap. The method includes partially removing the isolation layer. The method includes forming a gate stack over the first nanostructure stack, the second nanostructure stack, the isolation structure, and the isolation layer.

20 Claims, 23 Drawing Sheets

(51) Int. Cl.
*H10D 62/10* (2025.01)
*H10D 84/01* (2025.01)
*H10D 84/03* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,961,884 B2 * | 4/2024 | Lin .................. H01L 21/02274 |
| 2017/0110541 A1 * | 4/2017 | Xu .................... H01L 21/02603 |
| 2020/0105604 A1 * | 4/2020 | Lin .................. H01L 21/31053 |
| 2023/0335585 A1 * | 10/2023 | Xie ...................... H10D 84/83 |

* cited by examiner

SEMICONDUCTOR DEVICE STRUCTURE WITH AIR GAP AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1N-1 is a perspective view of a portion of the semiconductor device structure of FIG. 1N, in accordance with some embodiments.

FIG. 1O-1 is a perspective view of a portion of the semiconductor device structure of FIG. 1O, in accordance with some embodiments.

FIG. 1P-1 is a perspective view of a portion of the semiconductor device structure of FIG. 1P, in accordance with some embodiments.

FIG. 1P-2 is a cross-sectional view illustrating the semiconductor device structure along a sectional line I-I' in FIG. 1P, in accordance with some embodiments.

DETAILED DESCRIPTION

Figure 1A:
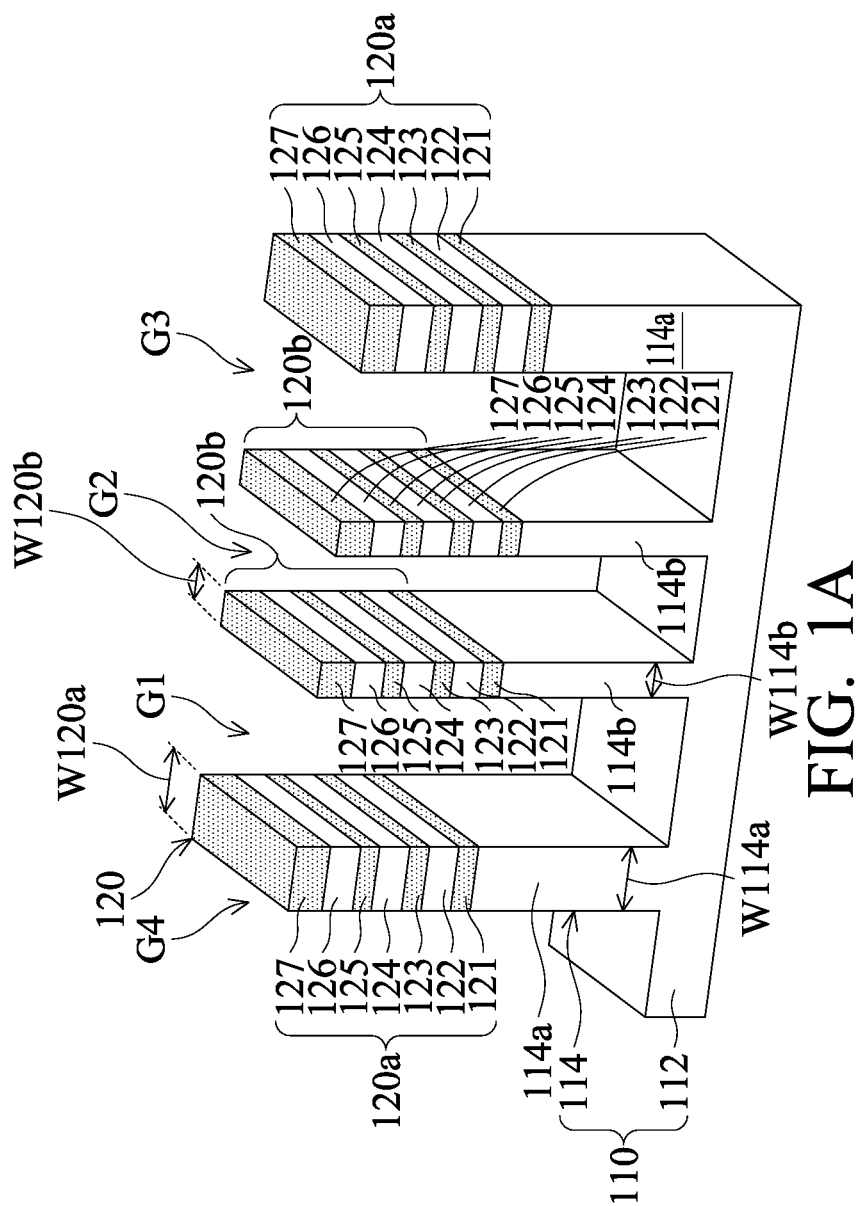
FIGS. 1A-1P are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
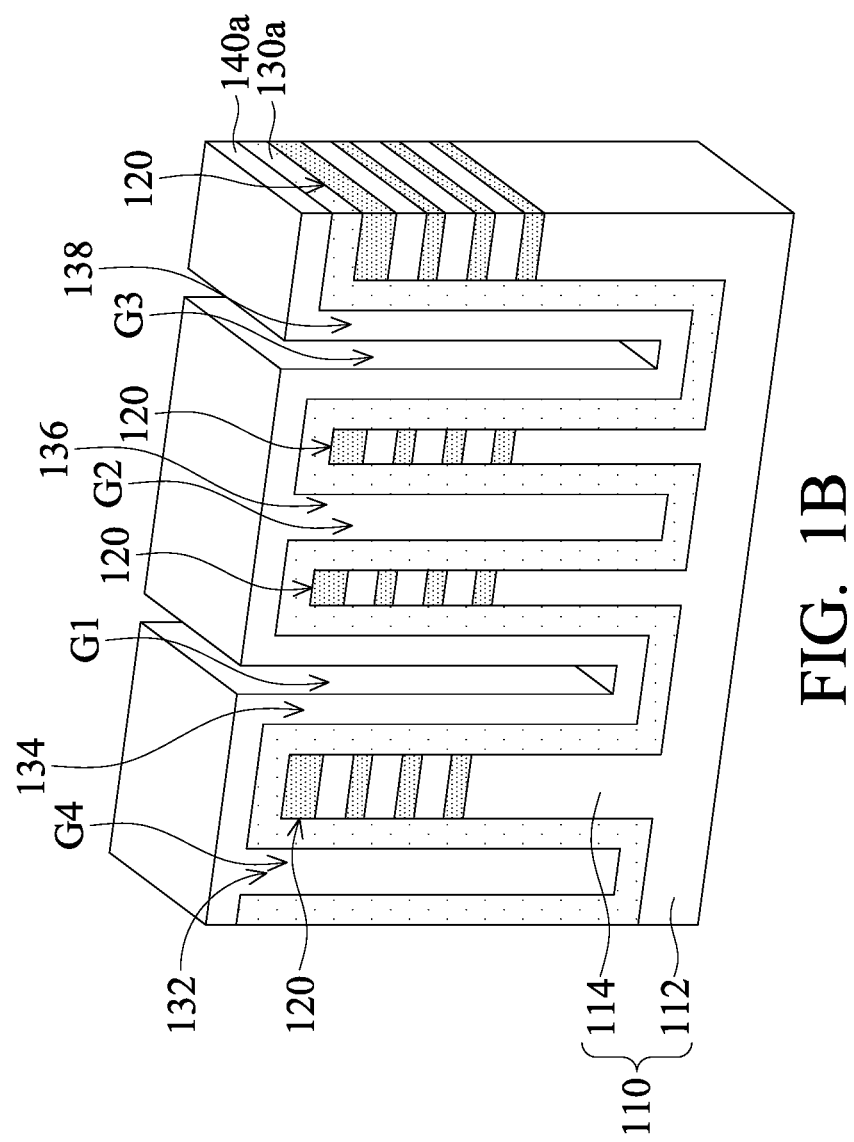
Figure 1C:
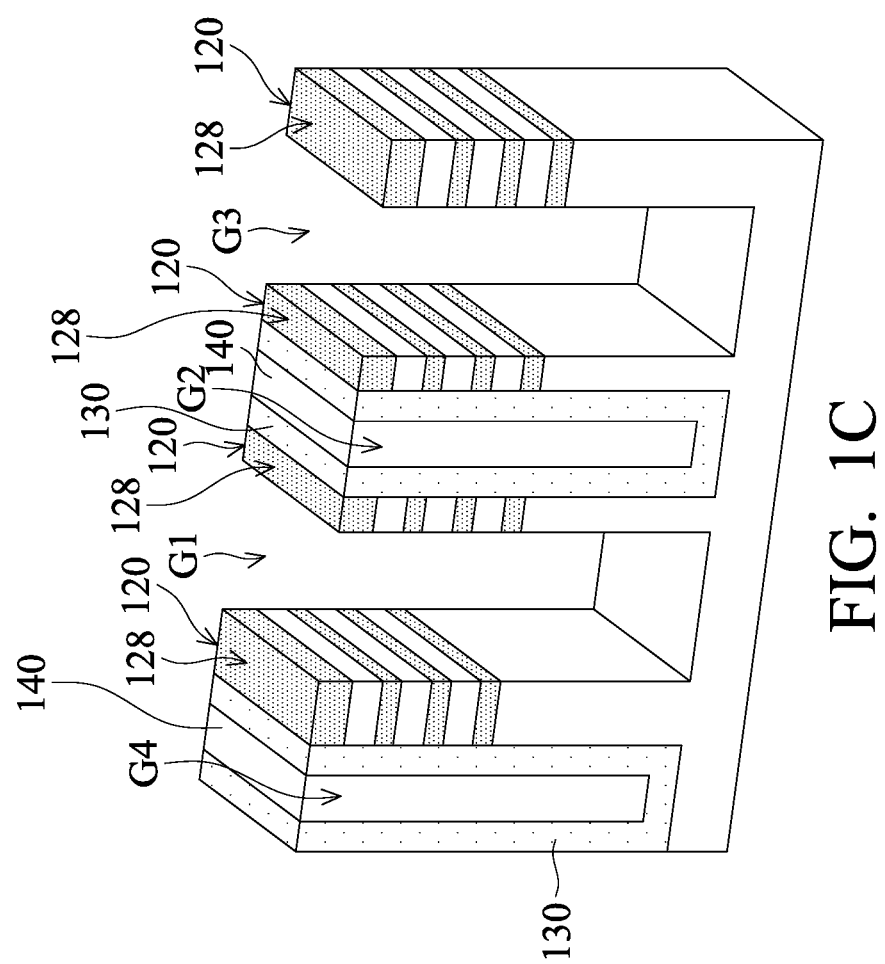
Figure 1D:
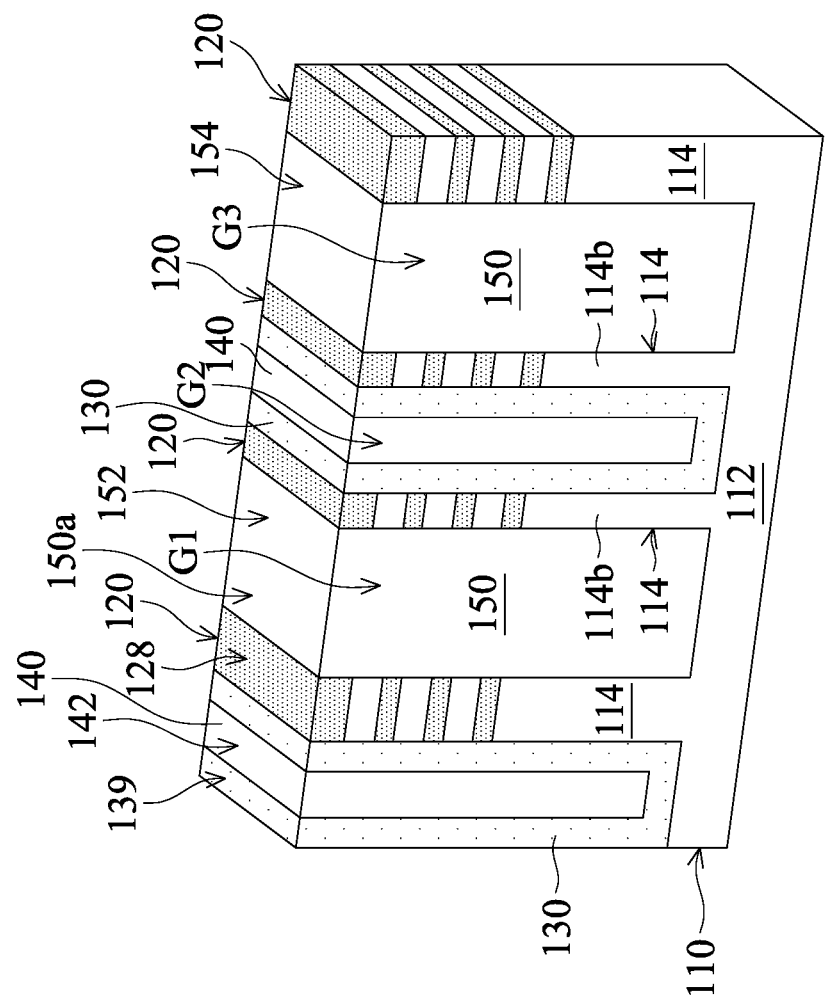
Figure 1E:
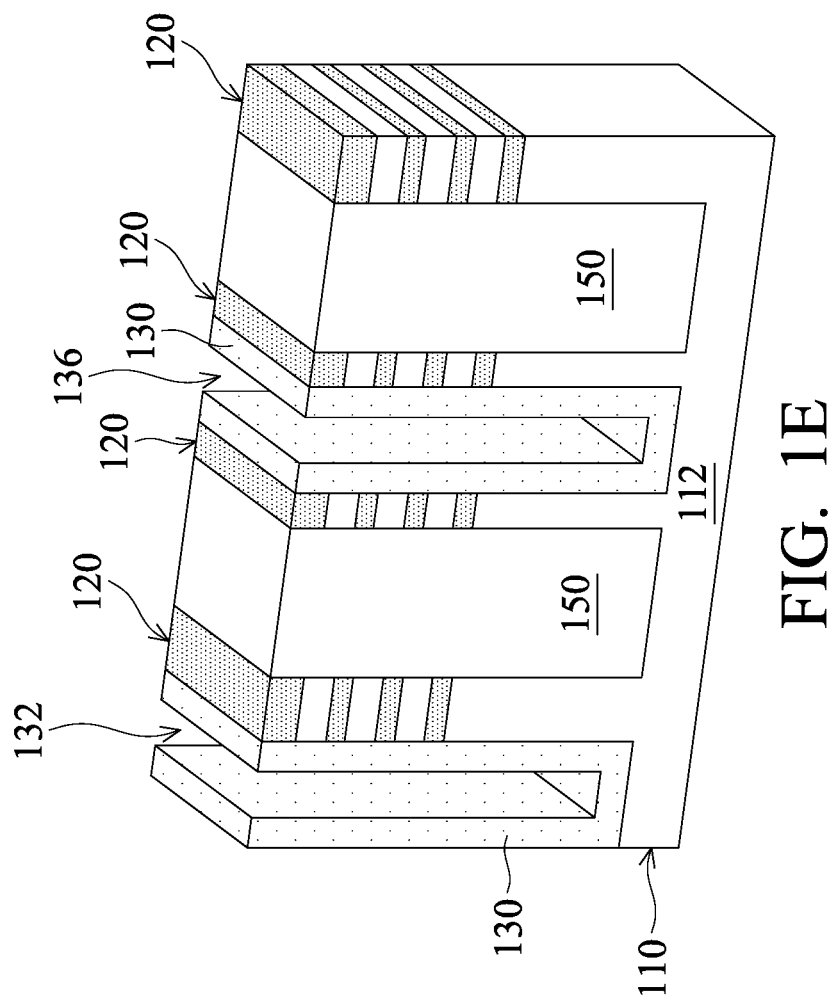
Figure 1F:
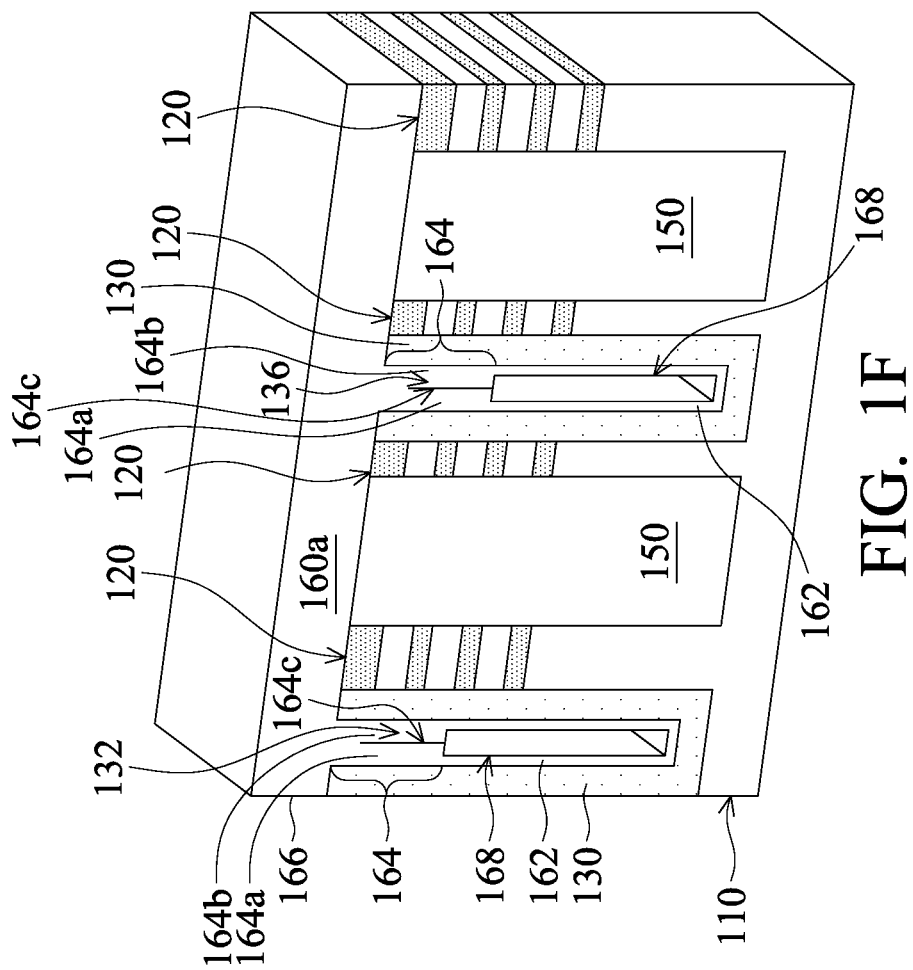
Figure 1G:
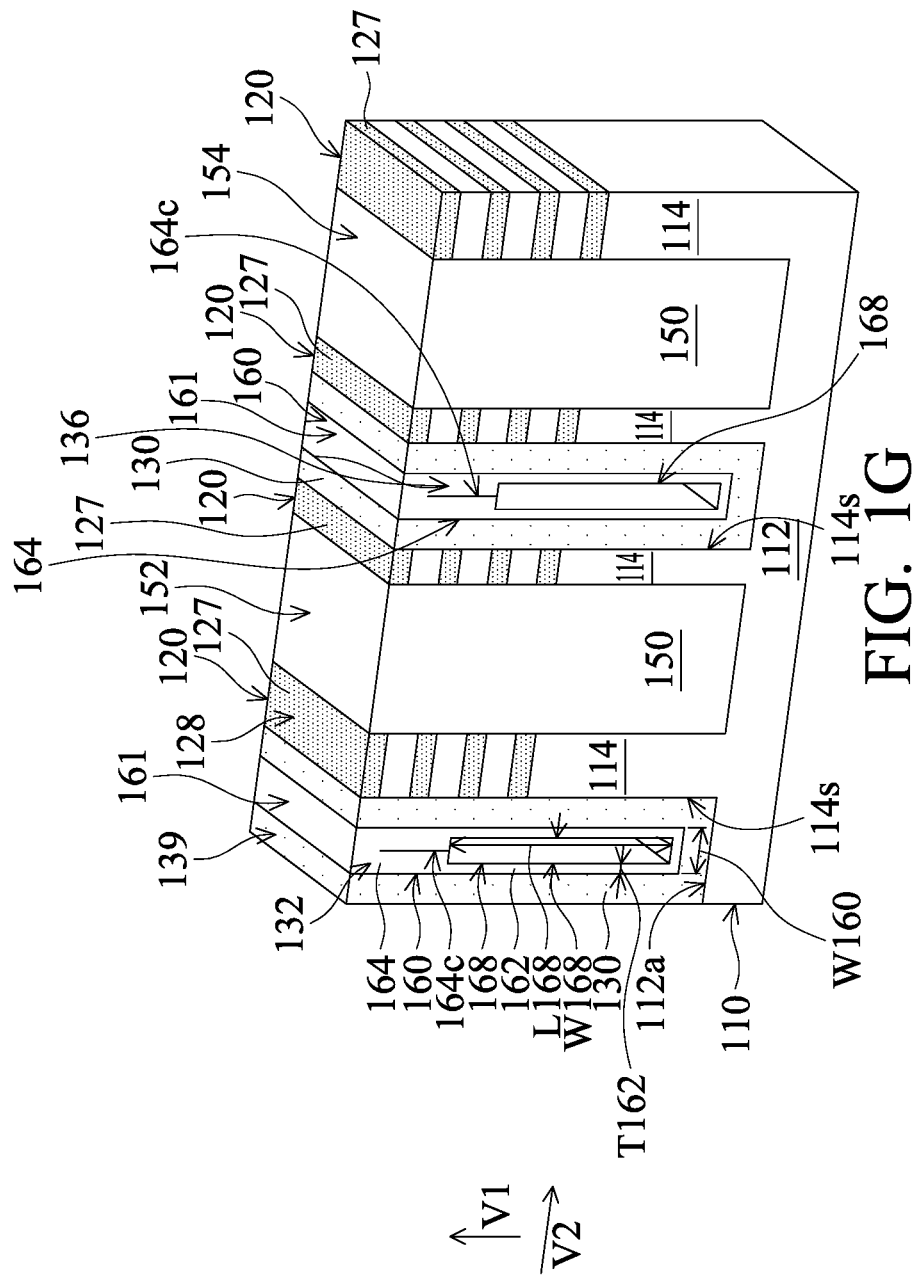
Figure 1H:
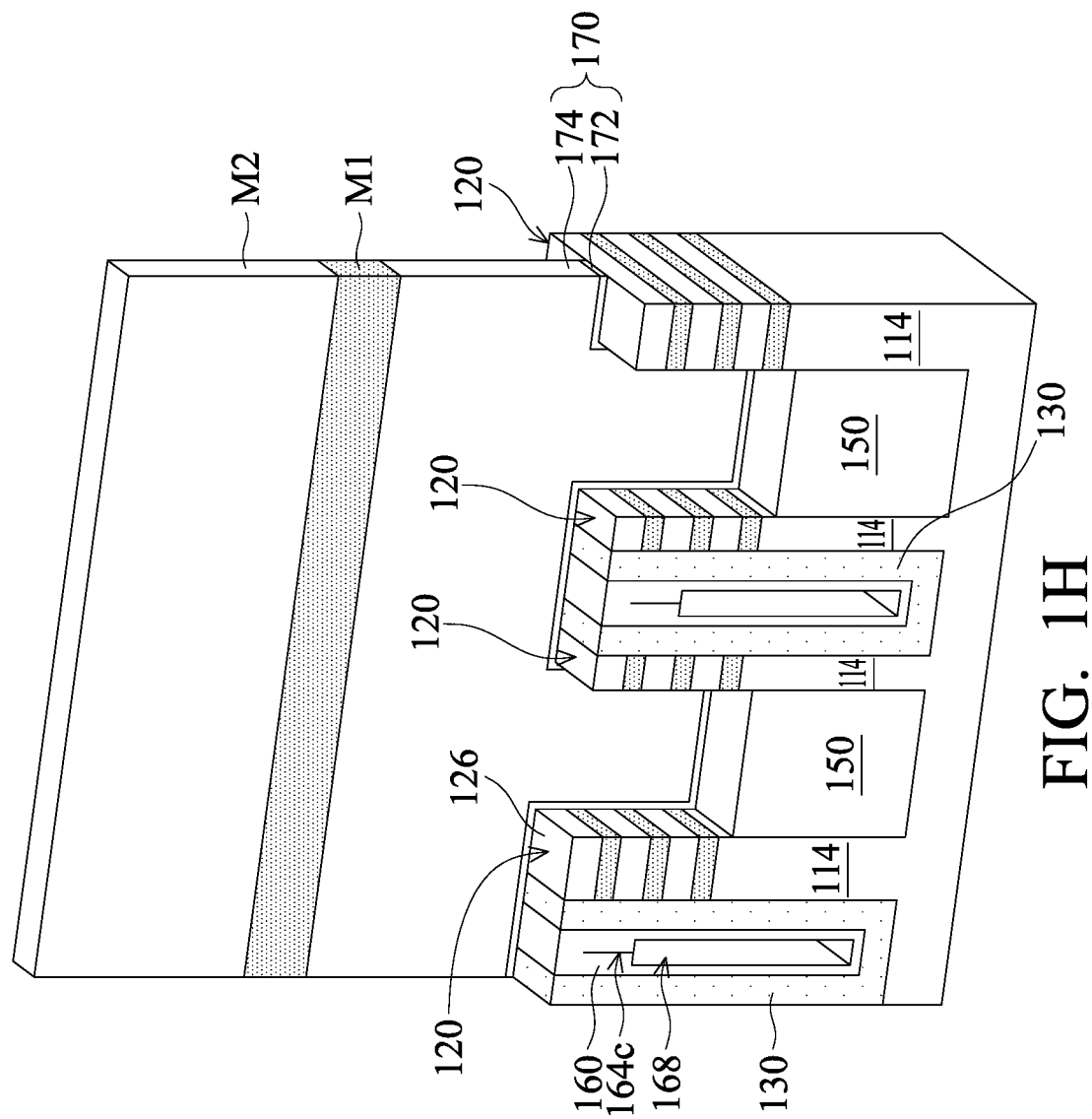
Figure 1I:
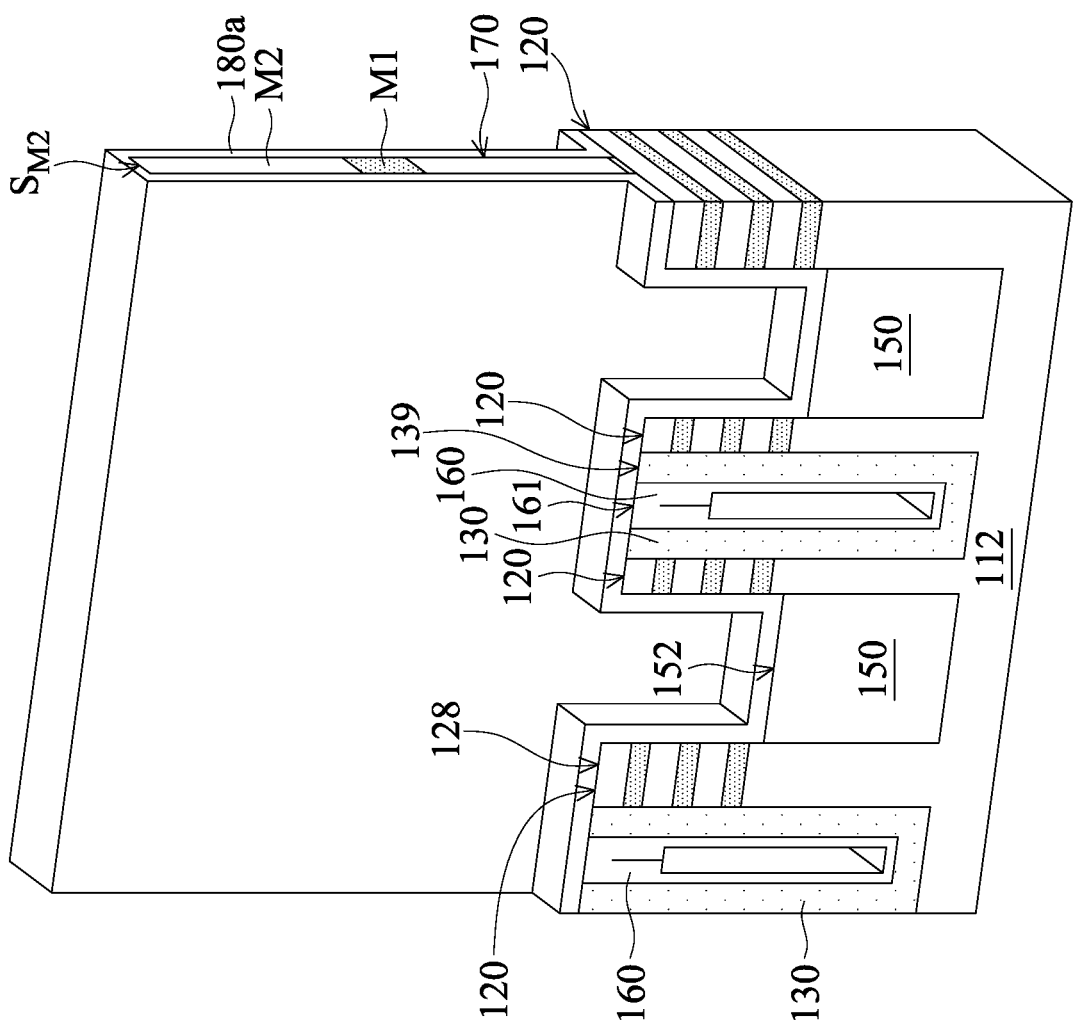
Figure 1J:
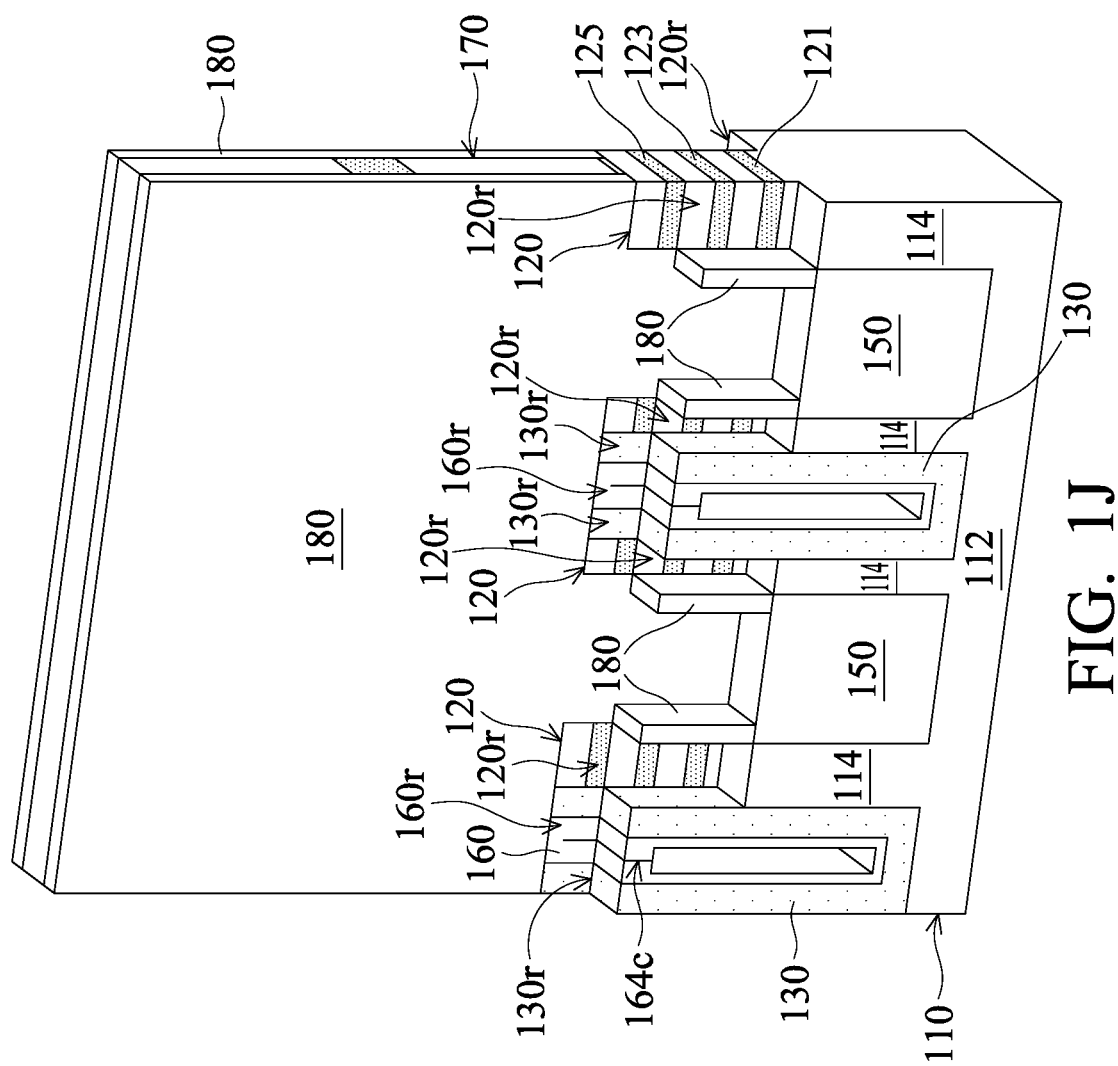
Figure 1K:
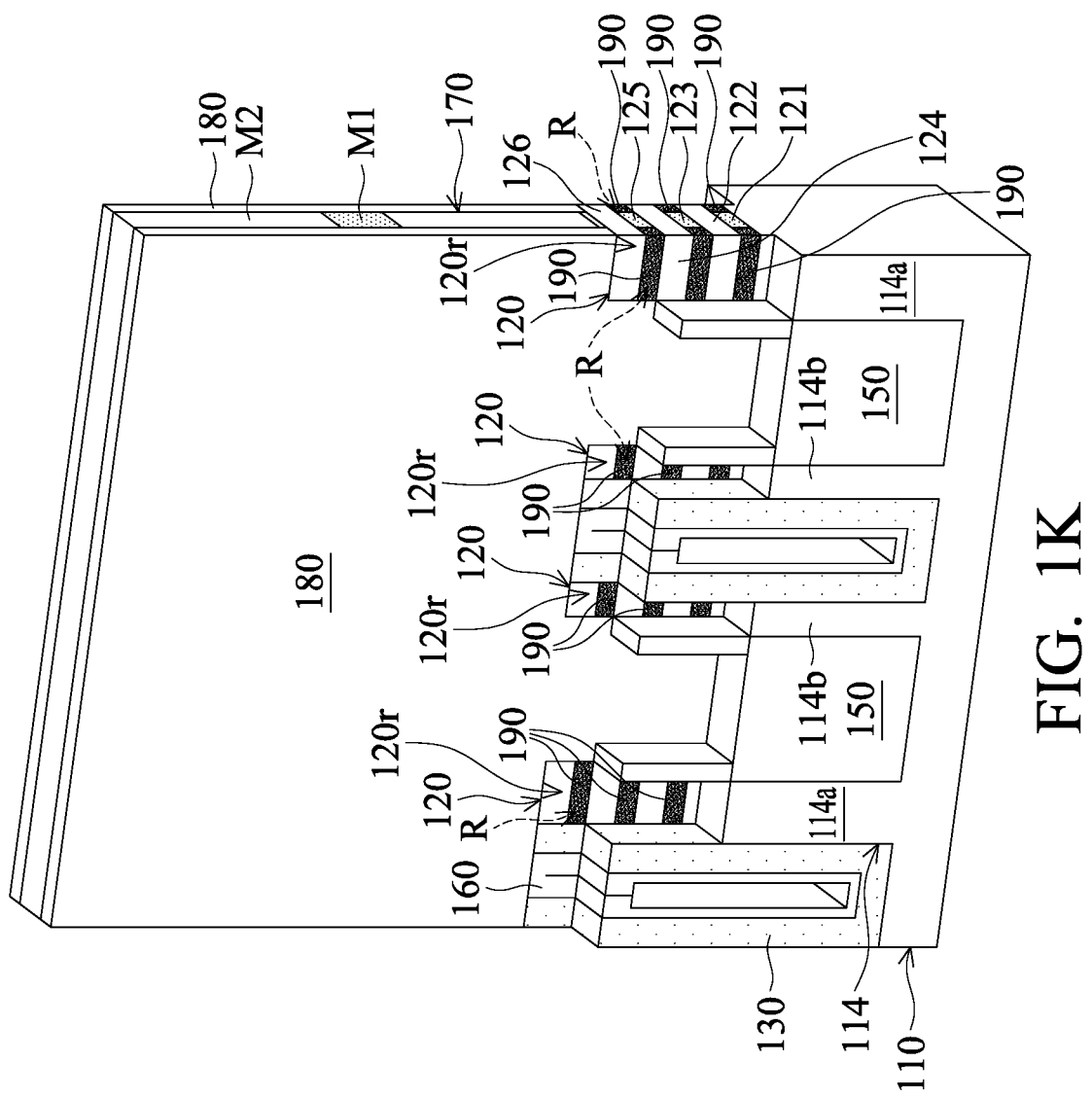
Figure 1L:
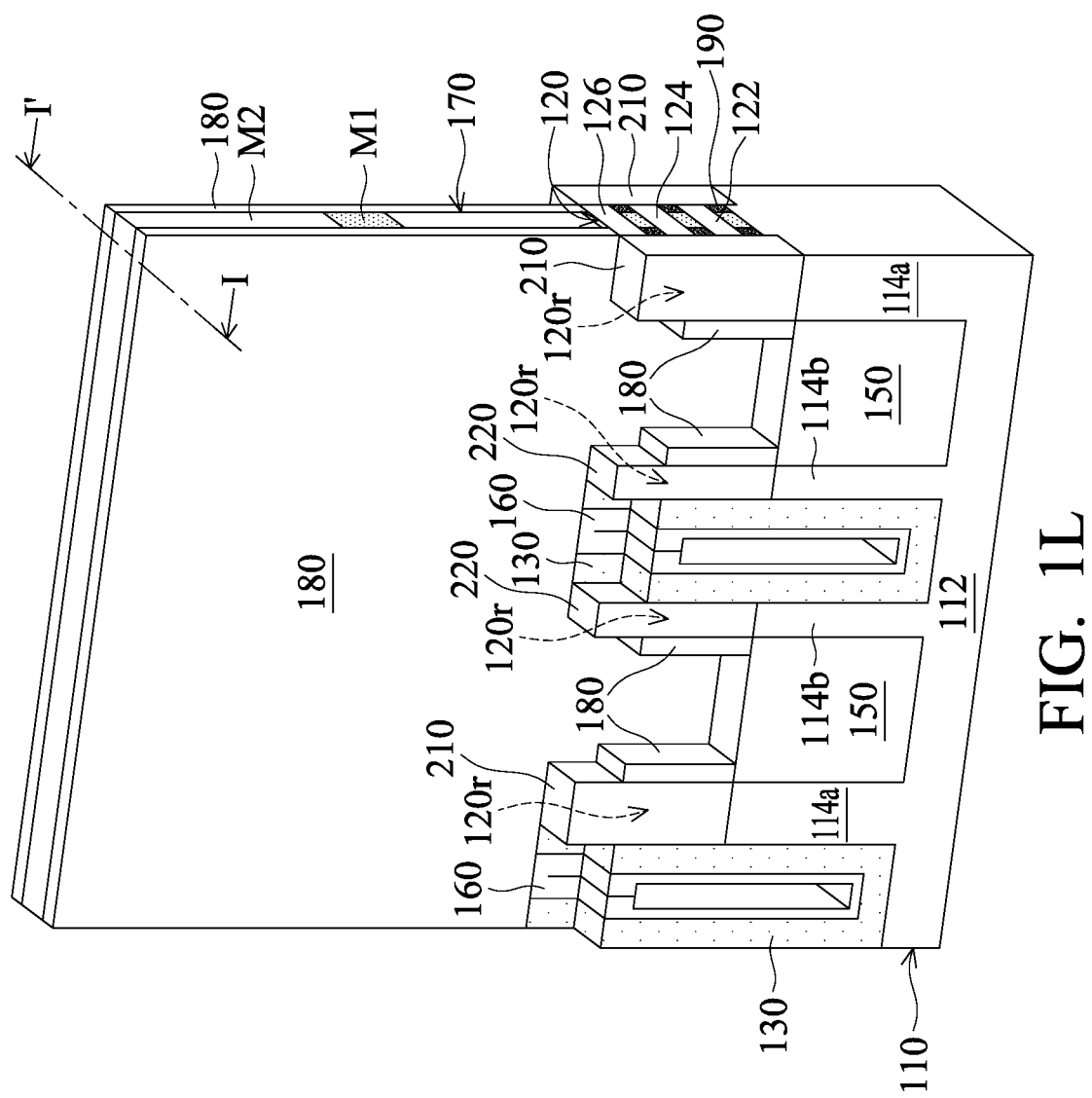
FIG. 1L-1 is a cross-sectional view illustrating the semiconductor device structure along a sectional line I-I' in FIG. 1L, in accordance with some embodiments.
Figures 1, 1L:
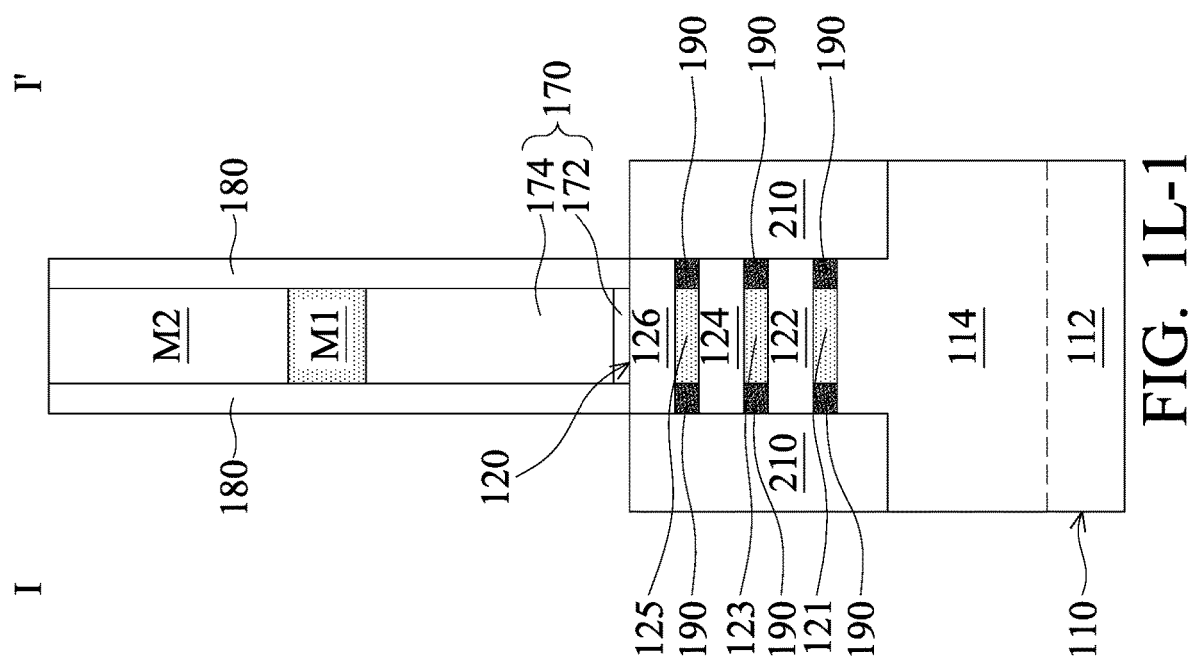
Figure 1M:
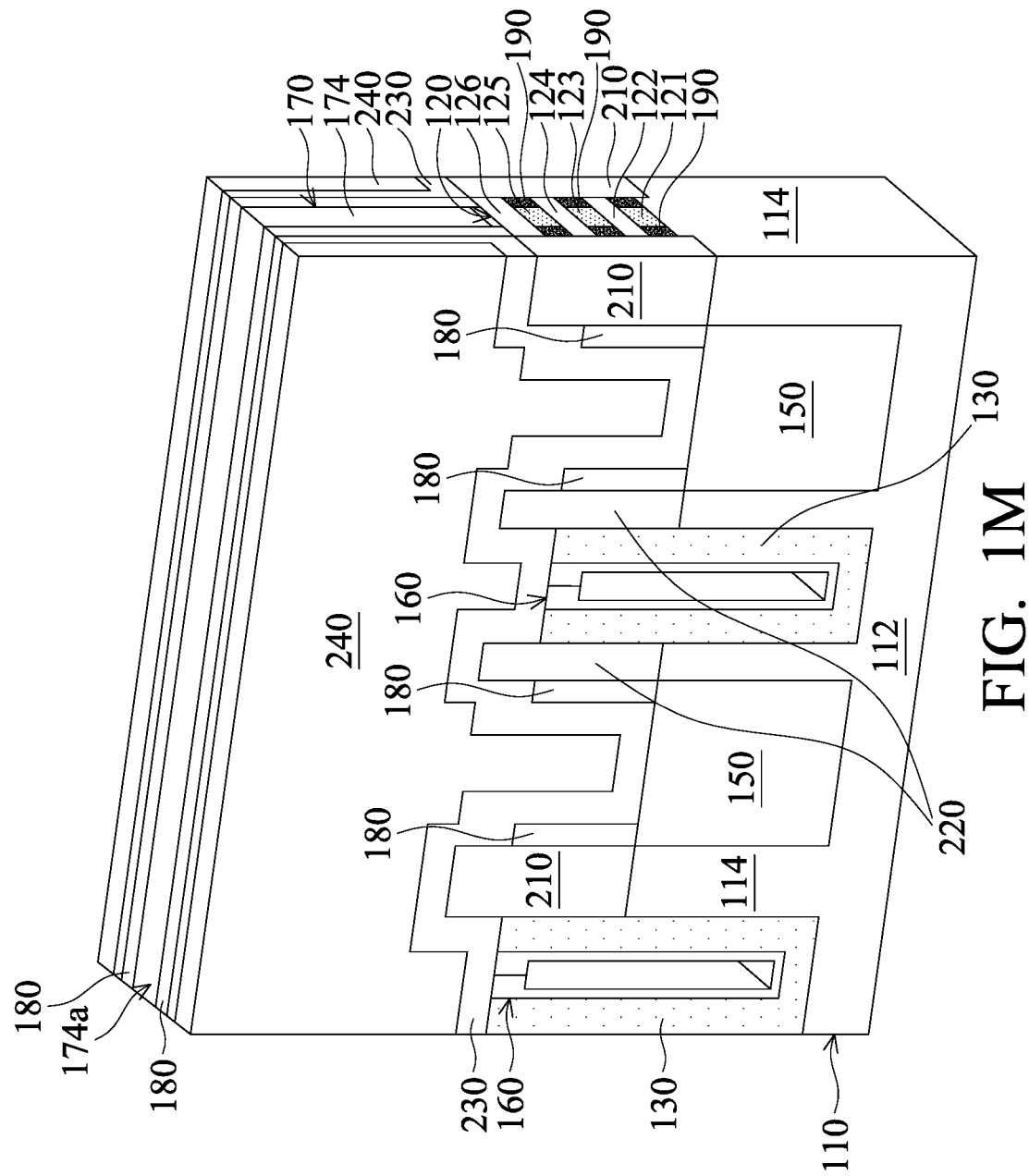
Figure 1N:
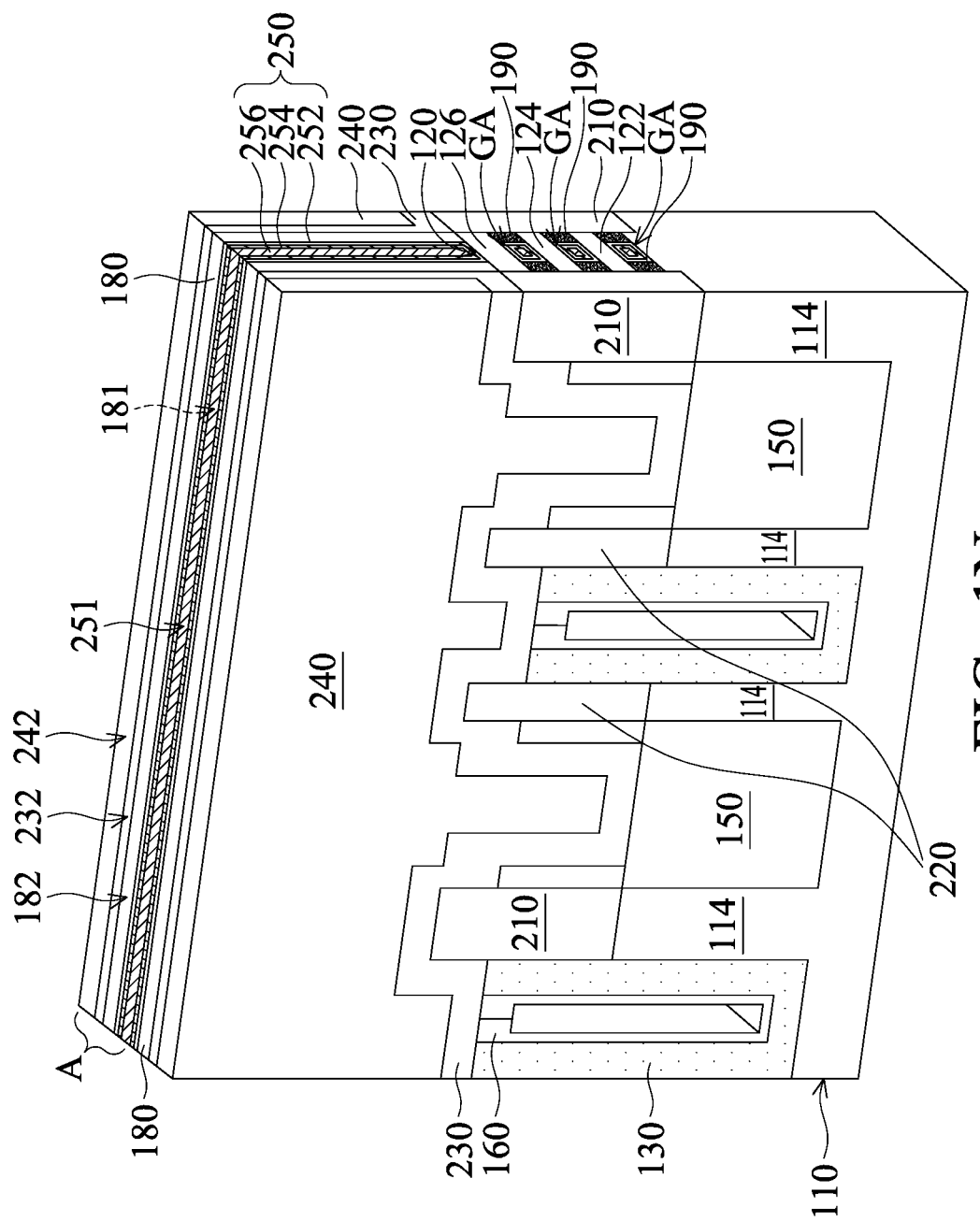
Figures 1, 1N:
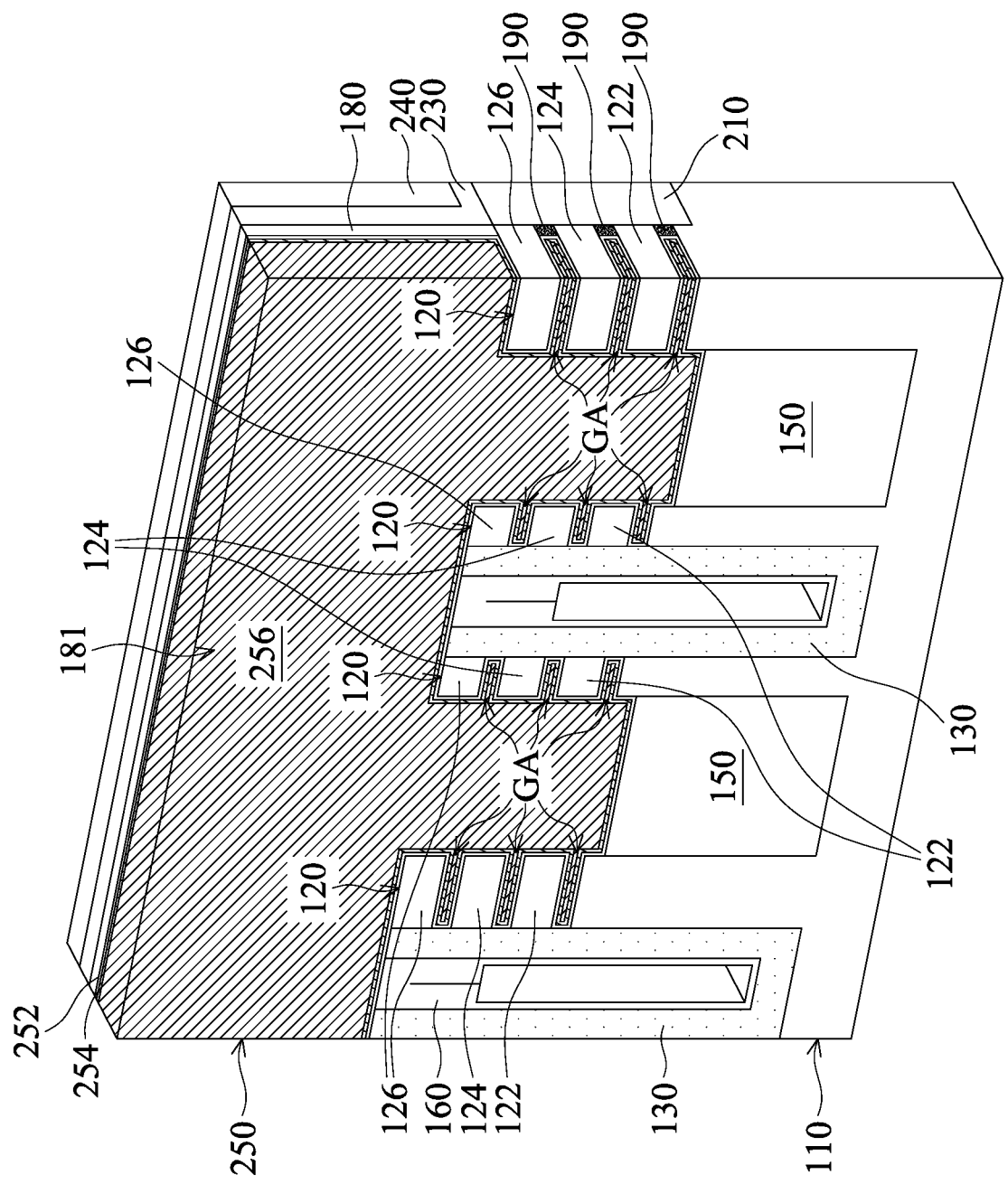
Figure 10:
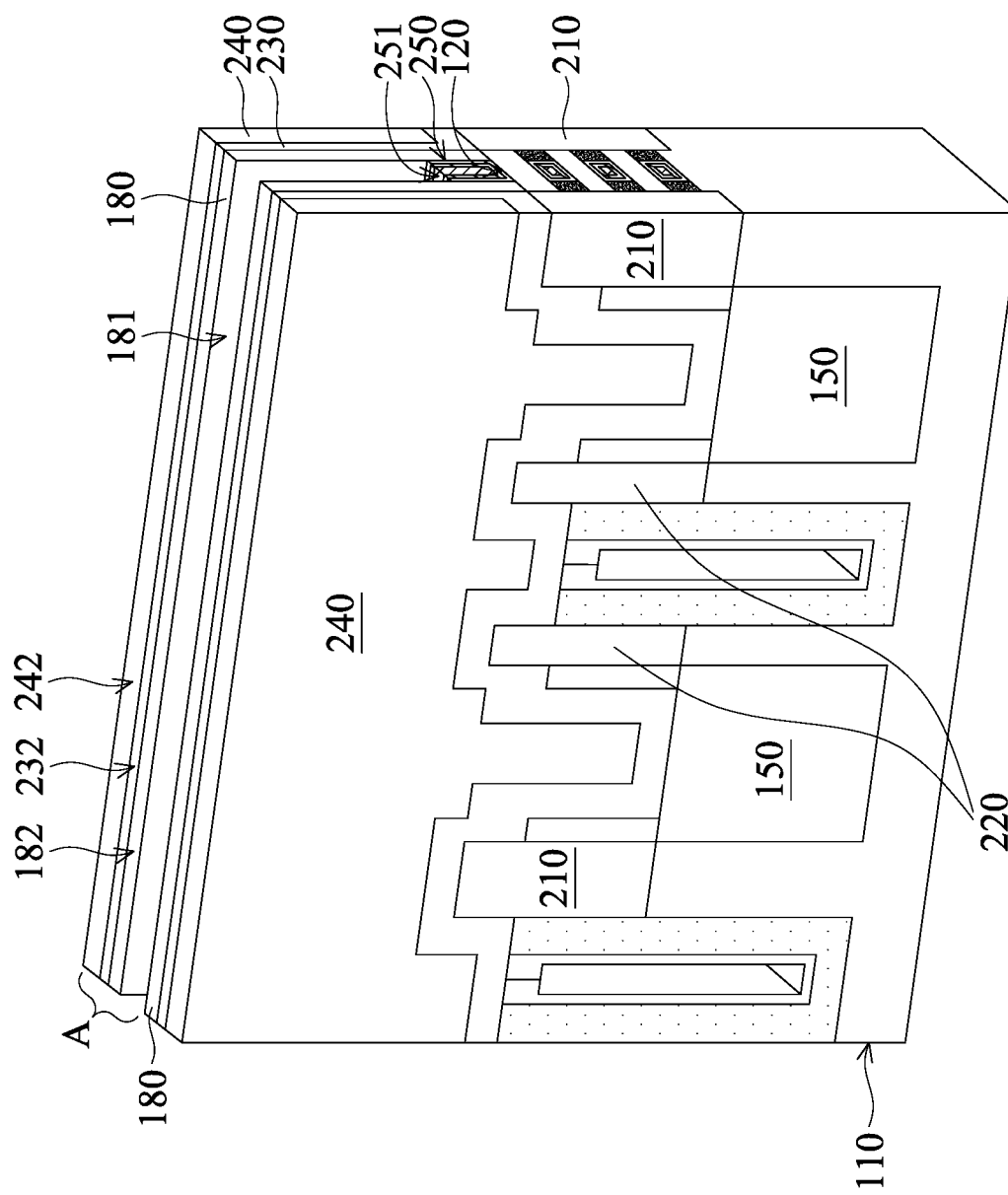
Figures 1, 10:
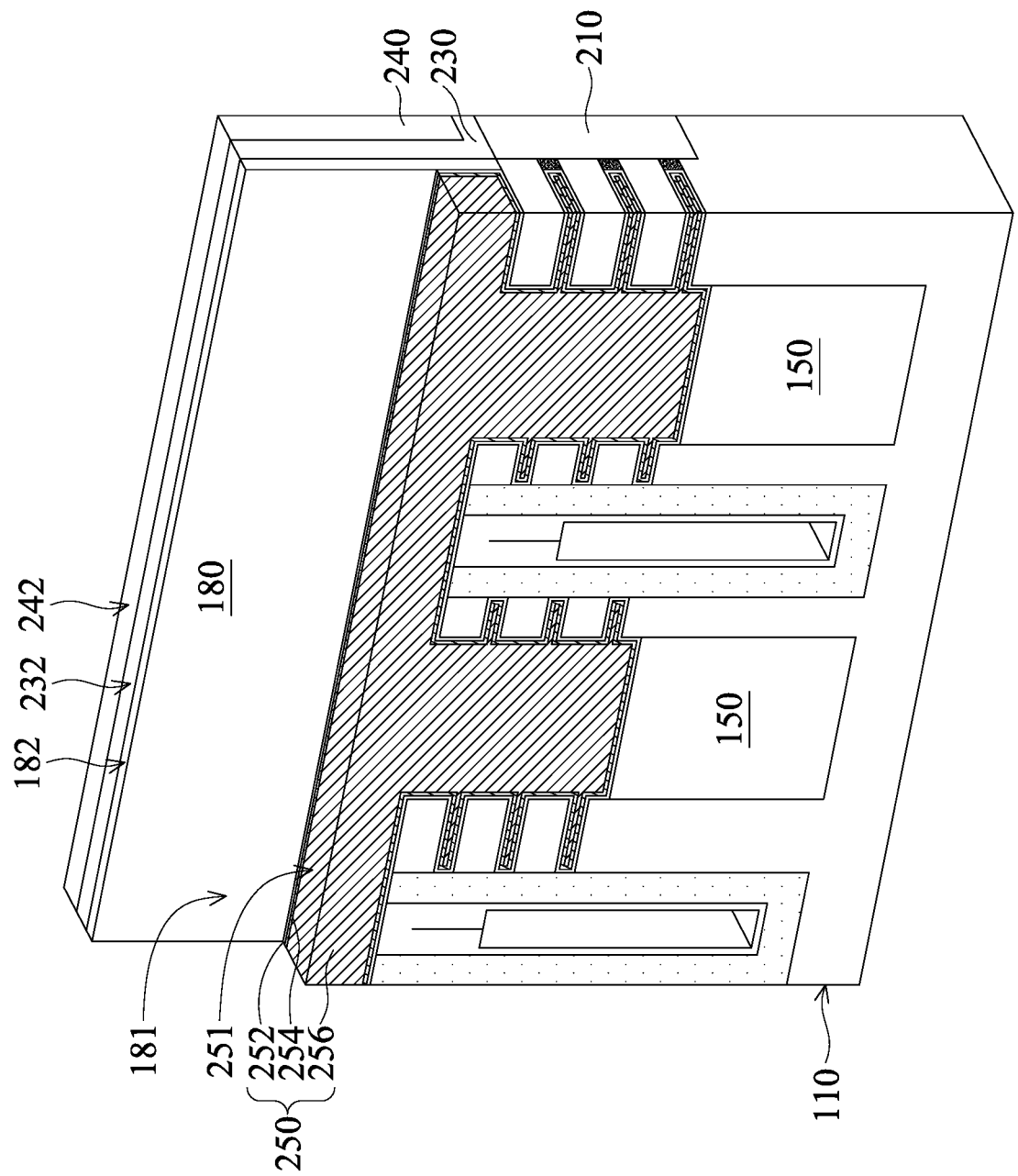
Figure 1P:
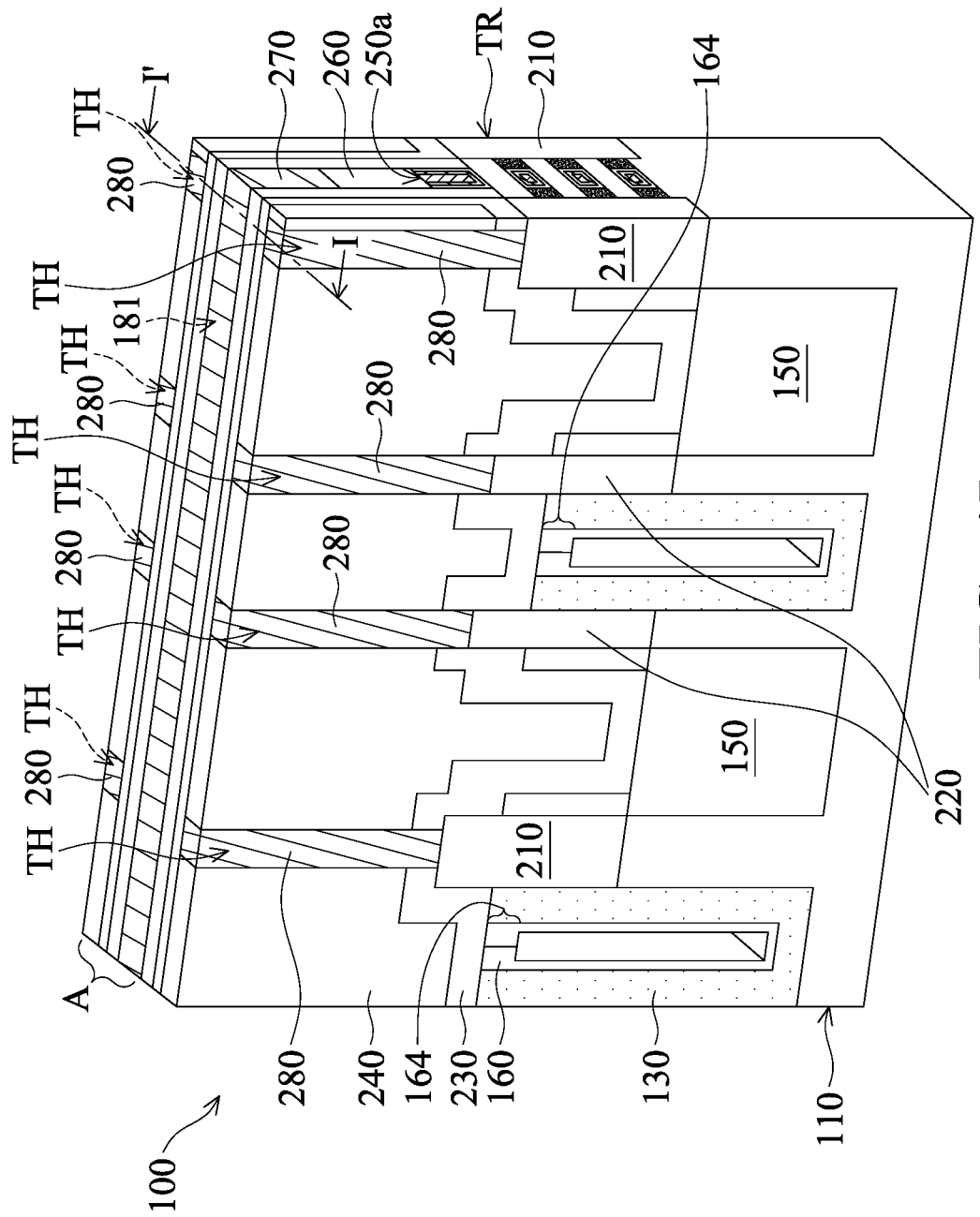
Figures 1, 1P:
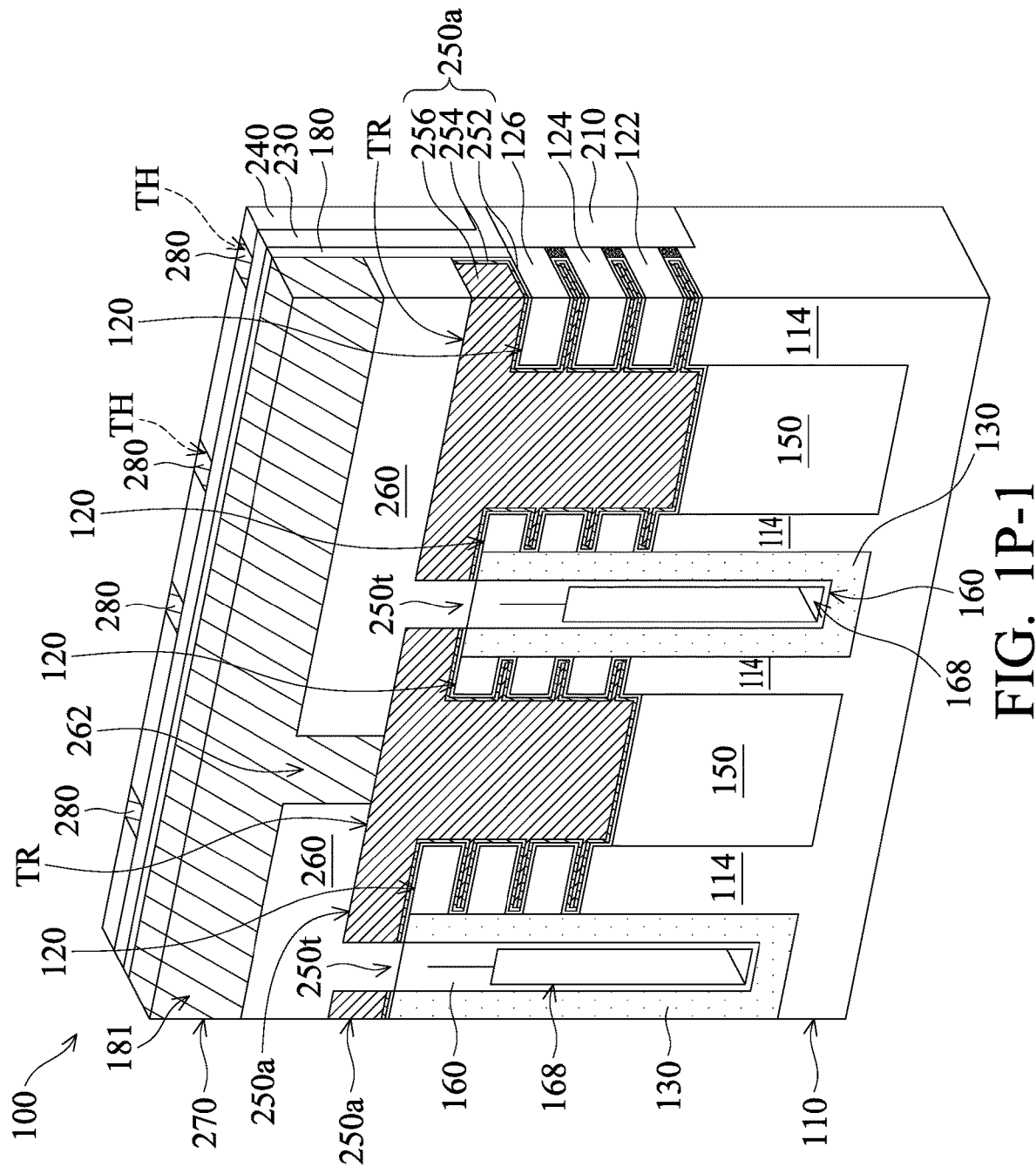

FIGS. 1A-1P are perspective views of various stages of a process for forming a semiconductor device structure, in accordance with some embodiments. As shown in FIG. 1A, a substrate 110 is provided, in accordance with some embodiments. The substrate 110 has a base 112 and fins 114 over the base 112, in accordance with some embodiments.

The fins 114 include wide fins 114a and narrow fins 114b, in accordance with some embodiments. In some embodiments, a width W114a of the wide fin 114a is greater than a width W114b of the narrow fin 114b. The wide fins 114a and the narrow fins 114b are used in different applications, in accordance with some embodiments. For example, the wide fins 114a and the narrow fins 114b are used in N-type transistors and P-type transistors respectively.

The substrate 110 includes, for example, a semiconductor substrate. The substrate 110 includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity.

Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, nanostructure stacks 120 are formed over the fins 114, in accordance with some embodiments. As shown in FIG. 1A, gaps G1, G2, G3, and G4 are formed adjacent to or between the fins 114 and the nanostructure stacks 120, in accordance with some embodiments.

The nanostructure stacks 120 include wide nanostructure stacks 120a and narrow nanostructure stacks 120b, in accordance with some embodiments. In some embodiments, a width W120a of the wide nanostructure stack 120a is greater than a width W120b of the narrow nanostructure stack 120b.

Each nanostructure stack 120 includes nanostructures 121, 122, 123, 124, 125, 126, and 127 sequentially formed over the corresponding fin 114, in accordance with some embodiments. The nanostructures 121, 122, 123, 124, 125, 126, and 127 are sequentially stacked over the fins 114, in accordance with some embodiments. The nanostructures 121, 122, 123, 124, 125, 126, and 127 include nanowires or nanosheets, in accordance with some embodiments.

The nanostructures 121, 123, 125, and 127 are made of a same first material, in accordance with some embodiments. The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The nanostructures 122, 124, and 126 are made of a same second material, in accordance with some embodiments. The second material is different from the first material, in accordance with some embodiments. The second material is the same as the material of the substrate 110, in accordance with some embodiments. The second material includes an elementary semiconductor material including silicon or germanium in a single crystal structure, a polycrystal structure, or an amorphous structure, in accordance with some embodiments.

The second material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

As shown in FIG. 1B, an insulating material layer 130a is conformally deposited over the nanostructure stacks 120 and the substrate 110, in accordance with some embodiments. The insulating material layer 130a has trenches 132, 134, 136, and 138 in the gaps G4, G1, G2, and G3 respectively, in accordance with some embodiments.

The insulating material layer 130a is made of an insulating material, such as an oxide-containing material (e.g., silicon oxide), a nitride-containing material (e.g., silicon nitride), an oxynitride-containing material (e.g., silicon oxynitride), or a carbide-containing material (e.g., SiCN or SiOC), in accordance with some embodiments. The deposition processes include chemical vapor deposition (CVD), physical vapor deposition (PVD), atomic layer deposition (ALD), or applicable methods.

As shown in FIG. 1B, a sacrificial material layer 140*a* is deposited over the insulating material layer 130*a* and in the trenches 132, 134, 136, and 138, in accordance with some embodiments. The trenches 132 and 136 are filled up by the sacrificial material layer 140*a*, in accordance with some embodiments. The sacrificial material layer 140*a* and the insulating material layer 130*a* are made of different materials, in accordance with some embodiments.

The sacrificial material layer 140*a* is made of an insulating material, such as an oxide-containing material (e.g., silicon oxide), a nitride-containing material (e.g., silicon nitride), an oxynitride-containing material (e.g., silicon oxynitride), or a carbide-containing material (e.g., SiCN or SiOC), in accordance with some embodiments. The deposition processes include chemical vapor deposition (CVD), physical vapor deposition (PVD), atomic layer deposition (ALD), or applicable methods.

As shown in FIG. 1C, the insulating material layer 130*a* and the sacrificial material layer 140*a* outside of the gaps G2 and G4 are removed, in accordance with some embodiments. The insulating material layer 130*a* remaining in the gaps G2 and G4 forms an insulating layer 130, in accordance with some embodiments. The sacrificial material layer 140*a* remaining in the gaps G2 and G4 forms a sacrificial layer 140, in accordance with some embodiments.

As shown in FIG. 1D, an isolation layer 150 is formed over the base 112 and in the gaps G1 and G3, in accordance with some embodiments. The fins 114 are surrounded by the isolation layer 150, in accordance with some embodiments. As shown in FIG. 1D, top surfaces 128, 139, 142, and 150*a* of the nanostructure stacks 120, the insulating layer 130, the sacrificial layer 140, and the isolation layer 150 are substantially level with each other, in accordance with some embodiments.

The isolation layer 150 has portions 152 and 154, in accordance with some embodiments. The narrow fins 114*b*, the insulating layer 130, and the sacrificial layer 140 in the gap G2 are between the portions 152 and 154, in accordance with some embodiments.

The isolation layer 150 is made of a material different from the materials of the insulating layer 130, in accordance with some embodiments. The isolation layer 150 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 150 is formed using a deposition process (or a spin-on process) and a chemical mechanical polishing process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

As shown in FIG. 1E, the sacrificial layer 140 is removed, in accordance with some embodiments. The removal process includes an etching process, in accordance with some embodiments. The etching process includes a dry etching process or a wet etching process, in accordance with some embodiments.

As shown in FIG. 1F, an isolation material layer 160*a* is deposited over the nanostructure stacks 120, the insulating layer 130, and the isolation layer 150 and in the trenches 132 and 136 of the insulating layer 130, in accordance with some embodiments.

The isolation material layer 160*a* has lower parts 162, middle parts 164, and an upper part 166, in accordance with some embodiments. The lower parts 162 and the middle parts 164 are in the trenches 132 and 136, in accordance with some embodiments. The middle part 164 is between the corresponding lower part 162 and the upper part 166, in accordance with some embodiments.

The deposition process includes a physical vapor deposition process, in accordance with some embodiments. Since the deposition rate of the isolation material layer 160*a* close to the openings of the trenches 132 and 136 is greater than the deposition rate of the isolation material layer 160*a* close to the bottoms of the trenches 132 and 136 in the physical vapor deposition process (i.e. the overhang characteristic), the isolation material layer 160*a* has air gaps 168 in the lower parts 162, in accordance with some embodiments. The air gaps 168 are sealed air gaps, in accordance with some embodiments.

Each middle part 164 is over the air gap 168, in accordance with some embodiments. Each middle part 164 has portions 164*a* and 164*b*, in accordance with some embodiments. The portions 164*a* and 164*b* are in direct contact with each other, in accordance with some embodiments. There is a boundary 164*c* between the portions 164*a* and 164*b*, in accordance with some embodiments. The boundary 164*c* is also referred to as a merged line, in accordance with some embodiments.

The isolation material layer 160*a* is made of a material different from the material of the isolation layer 150, in accordance with some embodiments. The isolation material layer 160*a* is made of an insulating material, such as an oxide-containing material (e.g., silicon oxide), a nitride-containing material (e.g., silicon nitride), an oxynitride-containing material (e.g., silicon oxynitride), or a carbide-containing material (e.g., SiCN or SiOC), in accordance with some embodiments. The deposition process includes a physical vapor deposition (PVD) process or applicable methods.

As shown in FIGS. 1F and 1G, the isolation material layer 160*a* outside of the trenches 132 and 136 of the insulating layer 130 is removed, in accordance with some embodiments. After the removal process, the isolation material layer 160*a* remaining in the trenches 132 and 136 forms the isolation structures 160, in accordance with some embodiments.

After the removal process, the top surfaces 128, 139, and 161 of the nanostructure stacks 120, the insulating layer 130, and the isolation structures 160 are substantially level with each other, in accordance with some embodiments. The isolation structure 160 is between the adjacent fins 114 to separate the adjacent fins 114, in accordance with some embodiments.

The isolation structure 160 is between the adjacent nanostructure stacks 120 to separate the adjacent nanostructure stacks 120, in accordance with some embodiments. The isolation structure 160 is between the portions 152 and 154 of the isolation layer 150, in accordance with some embodiments.

As shown in FIG. 1G, the insulating layer 130 is between the air gap 168 of the isolation structure 160 and the fin 114, in accordance with some embodiments. The insulating layer 130 is between the air gap 168 and the nanostructure stack 120, in accordance with some embodiments. The boundary 164*c* of each middle part 164 extends away from the base 112 of the substrate 110, in accordance with some embodiments. The boundary 164c is between the nanostructure stacks 120, in accordance with some embodiments.

In some embodiments, a length L168 of the air gap 168 is greater than a width W168 of the air gap 168. The length L168 is in a direction V1 perpendicular to a top surface 112a of the base 112, in accordance with some embodiments. The width W168 is in a direction V2 perpendicular to sidewalls 114s of the fins 114, in accordance with some embodiments.

In some embodiments, a ratio of the length L168 to the width W168 ranges from about 2 to about 10. In some embodiments, a ratio of the width W168 to a width W160 of the isolation structure 160 ranges from about 0.1 to about 0.9. In some embodiments, a thickness T162 of the lower part 162 of the isolation structure 160 ranges from about 2 nm to about 6 nm. In some embodiments, a ratio of the width W168 to the thickness T162 ranges from about 0.7 to about 1.3.

As shown in FIG. 1H, the isolation layer 150 is partially removed, and the nanostructures 127 are removed, in accordance with some embodiments. The fins 114 are partially embedded in the isolation layer 150, in accordance with some embodiments. As shown in FIG. 1H, a gate stack 170 is formed over the fins 114, the nanostructure stacks 120, the insulating layer 130, the isolation layer 150, and the isolation structures 160, in accordance with some embodiments. The boundary 164c extends from the air gap 168 toward the gate stack 170, in accordance with some embodiments.

The gate stack 170 includes a gate dielectric layer 172 and a gate electrode 174, in accordance with some embodiments. The gate electrode 174 is over the gate dielectric layer 172, in accordance with some embodiments. The gate dielectric layer 172 is positioned between the gate electrode 174 and the nanostructure stacks 120, in accordance with some embodiments.

The gate dielectric layer 172 is also positioned between the gate electrode 174 and the fins 114, in accordance with some embodiments. The gate dielectric layer 172 is positioned between the gate electrode 174 and the isolation layer 150, in accordance with some embodiments.

The gate dielectric layer 172 is also positioned between the gate electrode 174 and the insulating layer 130, in accordance with some embodiments. The gate dielectric layer 172 is positioned between the gate electrode 174 and the isolation structure 160, in accordance with some embodiments.

The gate dielectric layer 172 is made of an oxide-containing material such as silicon oxide, in accordance with some embodiments. The gate dielectric layer 172 is formed using a chemical vapor deposition process and an etching process, in accordance with some embodiments. The gate electrode 174 is made of a semiconductor material such as polysilicon, in accordance with some embodiments. The gate electrode 174 is formed using a chemical vapor deposition process and an etching process, in accordance with some embodiments.

As shown in FIG. 1H, a mask layer M1 is formed over the gate stack 170, in accordance with some embodiments. The mask layer M1 is made of a material different from the materials of the gate stack 170, in accordance with some embodiments. The mask layer M1 is made of nitrides (e.g., silicon nitride) or oxynitride (e.g., silicon oxynitride), in accordance with some embodiments.

As shown in FIG. 1H, a mask layer M2 is formed over the mask layer M1, in accordance with some embodiments. The mask layer M2 is made of a material different from the material of the mask layer M1, in accordance with some embodiments. The mask layer M2 is made of oxides (e.g., silicon oxides), in accordance with some embodiments.

As shown in FIG. 1I, a spacer layer 180a is formed over the nanostructure stacks 120, the insulating layer 130, the isolation structures 160, the gate stack 170, and the mask layers M1 and M2, in accordance with some embodiments. The spacer layer 180a conformally covers the nanostructure stacks 120, the insulating layer 130, the isolation structures 160, the gate stack 170, and the mask layers M1 and M2, in accordance with some embodiments.

The spacer layer 180a includes an insulating material, such as silicon oxide, silicon nitride, silicon oxynitride, or silicon carbide, in accordance with some embodiments. The spacer layer 180a is made of a material different from that of the gate stack 170 and the mask layers M1 and M2, in accordance with some embodiments. The formation of the spacer layer 180a includes a deposition process, in accordance with some embodiments.

As shown in FIGS. 1I and 1J, upper portions of the spacer layer 180a, the insulating layer 130, and the isolation structures 160 are removed, in accordance with some embodiments. The upper portions of the spacer layer 180a over the top surfaces 128, 139, 152, 161, and $S_{M2}$ of the nanostructure stacks 120, the insulating layer 130, the isolation layer 150, the isolation structures 160, and the mask layer M2 are removed, in accordance with some embodiments.

After the removal process, the remaining spacer layer 180a forms a spacer structure 180, in accordance with some embodiments. The spacer structure 180 surrounds the gate stack 170 and the mask layers M1 and M2, in accordance with some embodiments. The spacer structure 180 is positioned over the nanostructure stacks 120, the fins 114, and the isolation layer 150, in accordance with some embodiments.

After the removal process, recesses 160r are formed in the isolation structures 160, and recesses 130r are formed in the insulating layer 130, in accordance with some embodiments. The removal process includes an anisotropic etching process, in accordance with some embodiments.

As shown in FIG. 1J, portions of the nanostructure stacks 120, which are not covered by the gate stack 170 and the spacer structure 180, are removed, in accordance with some embodiments. The removal process forms trenches 120r in the nanostructure stacks 120 and the fins 114, in accordance with some embodiments.

The removal process includes an etching process, in accordance with some embodiments. The etching process includes an anisotropic etching process such as a dry etching process, in accordance with some embodiments.

As shown in FIG. 1K, end portions of the nanostructures 121, 123, and 125 are removed through the trenches 120r, in accordance with some embodiments. The removal process forms recesses R in the nanostructure stacks 120, in accordance with some embodiments. The recesses R are adjacent to the nanostructures 121, 123, and 125, in accordance with some embodiments. The removal process includes an etching process such as a dry etching process or a wet etching process, in accordance with some embodiments.

As shown in FIG. 1K, an inner spacer material layer (not shown) is formed over the mask layers M1 and M2, the spacer structure 180, the nanostructure stacks 120 and the fins 114, in accordance with some embodiments. The recesses R are filled with the inner spacer material layer, in accordance with some embodiments. The inner spacer material layer is in direct contact with sidewalls of the nanostructures 121, 123, and 125, in accordance with some embodiments.

The inner spacer material layer is made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "high-k material" means a material having a dielectric constant greater than the dielectric constant of silicon dioxide, in accordance with some embodiments. The term "low-k material" means a material having a dielectric constant less than the dielectric constant of silicon dioxide, in accordance with some embodiments. The inner spacer material layer is formed using a deposition process such as a physical vapor deposition process, a chemical vapor deposition process, an atomic layer deposition process, or the like, in accordance with some embodiments.

As shown in FIG. 1K, the portions of the inner spacer material layer outside of the recesses R are removed to form inner spacers 190 in the recesses R, in accordance with some embodiments.

FIG. 1L-1 is a cross-sectional view illustrating the semiconductor device structure along a sectional line I-I' in FIG. 1L, in accordance with some embodiments. As shown in FIGS. 1L and 1L-1, source/drain structures 210 and 220 are formed in the trenches 120*r*, in accordance with some embodiments.

The source/drain structures 210 and 220 are connected to the nanostructures 122, 124, and 126, in accordance with some embodiments. The source/drain structures 210 and 220 are in direct contact with the nanostructures 122, 124, and 126, the inner spacers 190, and the substrate 110, in accordance with some embodiments.

In some other embodiments, the source/drain structures 210 are made of a semiconductor material (e.g., silicon) with N-type dopants, such as the Group VA element, in accordance with some embodiments. The Group VA element includes phosphor (P), antimony (Sb), or another suitable Group VA material. The source/drain structures 210 are formed using an epitaxial process, in accordance with some embodiments.

In some embodiments, the source/drain structures 220 are made of a semiconductor material (e.g., silicon germanium) with P-type dopants, such as the Group IIIA element, in accordance with some embodiments. The Group IIIA element includes boron or another suitable material. The source/drain structures 220 are formed using an epitaxial process, in accordance with some embodiments.

The formation of the source/drain structures 210 and 220 includes forming a first mask layer (not shown) over the narrow fins 114*b*; forming the source/drain structures 210 over the wide fins 114*a*; removing the first mask layer; forming a second mask layer (not shown) over the source/drain structures 210; forming the source/drain structures 220 over the narrow fins 114*b*; and removing the second mask layer, in accordance with some embodiments.

As shown in FIGS. 1L and 1M, an etch stop material layer (not shown) and a dielectric material layer (not shown) are sequentially formed over the mask layers M1 and M2, the gate stack 170, the source/drain structures 210 and 220, the spacer structure 180, and the isolation layer 150, in accordance with some embodiments.

The etch stop material layer includes a nitride-containing material (e.g., silicon nitride) or an oxynitride-containing material (e.g., silicon oxynitride), in accordance with some embodiments. The dielectric material layer includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric material layer is formed by a deposition process (e.g., a chemical vapor deposition process), in accordance with some embodiments.

As shown in FIGS. 1L and 1M, a planarization process is performed to remove the mask layers M1 and M2 and top portions of the etch stop material layer, the dielectric material layer, and the spacer structure 180, in accordance with some embodiments.

After the removal process, the remaining etch stop material layer forms an etch stop layer 230, and the remaining dielectric material layer forms a dielectric layer 240, in accordance with some embodiments. The planarization process includes a chemical mechanical polishing process, in accordance with some embodiments.

FIG. 1N-1 is a perspective view of a portion A of the semiconductor device structure of FIG. 1N, in accordance with some embodiments. As shown in FIGS. 1N and 1N-1, the gate stack 170 is removed, in accordance with some embodiments. The removal process forms a trench 181 in the spacer structure 180, in accordance with some embodiments.

As shown in FIGS. 1M, 1N, and 1N-1, the nanostructures 121, 123, and 125 are removed through the trench 181, in accordance with some embodiments. The removal process for removing the gate stack 170 and the nanostructures 121, 123, and 125 includes an etching process such as a wet etching process or a dry etching process, in accordance with some embodiments.

As shown in FIGS. 1N and 1N-1, a gate stack structure 250 is formed in the trench 181, in accordance with some embodiments. The gate stack structure 250 surrounds the nanostructures 122, 124, and 126, in accordance with some embodiments.

The gate stack structure 250 includes a gate dielectric layer 252, a work function metal layer 254, and a gate electrode layer 256, in accordance with some embodiments. The gate dielectric layer 252 conformally covers the nanostructures 122, 124, and 126 and inner walls and a bottom surface of the trench 181, in accordance with some embodiments. The gate dielectric layer 252 is made of a high-K material, such as $HfO_2$, $ZrO_2$, $HfZrO_2$, or $Al_2O_3$. The gate dielectric layer 252 is formed using an atomic layer deposition process or another suitable process.

The work function metal layer 254 is conformally formed over the gate dielectric layer 252, in accordance with some embodiments. The work function metal layer 254 is made of TiN, TaN, TiSiN, or another suitable conductive material. The work function metal layer 254 is formed using an atomic layer deposition process or another suitable process.

The gate electrode layer 256 is formed over the work function metal layer 254, in accordance with some embodiments. The gate electrode layer 256 is made of W, Co, Al, or another suitable conductive material. The gate electrode layer 256 is formed using an atomic layer deposition process or another suitable process.

As shown in FIG. 1N, the nanostructures 122, 124, and 126 pass through the gate stack structure 250, in accordance with some embodiments. The fins 114 and the nanostructures 122, 124, and 126 are spaced apart from each other, in accordance with some embodiments.

As shown in FIG. 1N, top surfaces 182, 232, 242, and 251 of the spacer structure 180, the etch stop layer 230, the dielectric layer 240, and the gate stack structure 250 are substantially level with each other, in accordance with some embodiments.

FIG. 1O-1 is a perspective view of a portion A of the semiconductor device structure of FIG. 1O, in accordance with some embodiments. As shown in FIGS. 1O and 1O-1, a top portion of the gate stack structure 250 is removed, in accordance with some embodiments.

After the removal process, the top surface 251 of the gate stack structure 250 is lower than the top surfaces 182, 232, and 242 of the spacer structure 180, the etch stop layer 230, and the dielectric layer 240, in accordance with some embodiments.

The removal process includes an etching process, in accordance with some embodiments. The etching process includes a dry etching process or a wet etching process, in accordance with some embodiments.

Figures 1, 1P, 2:
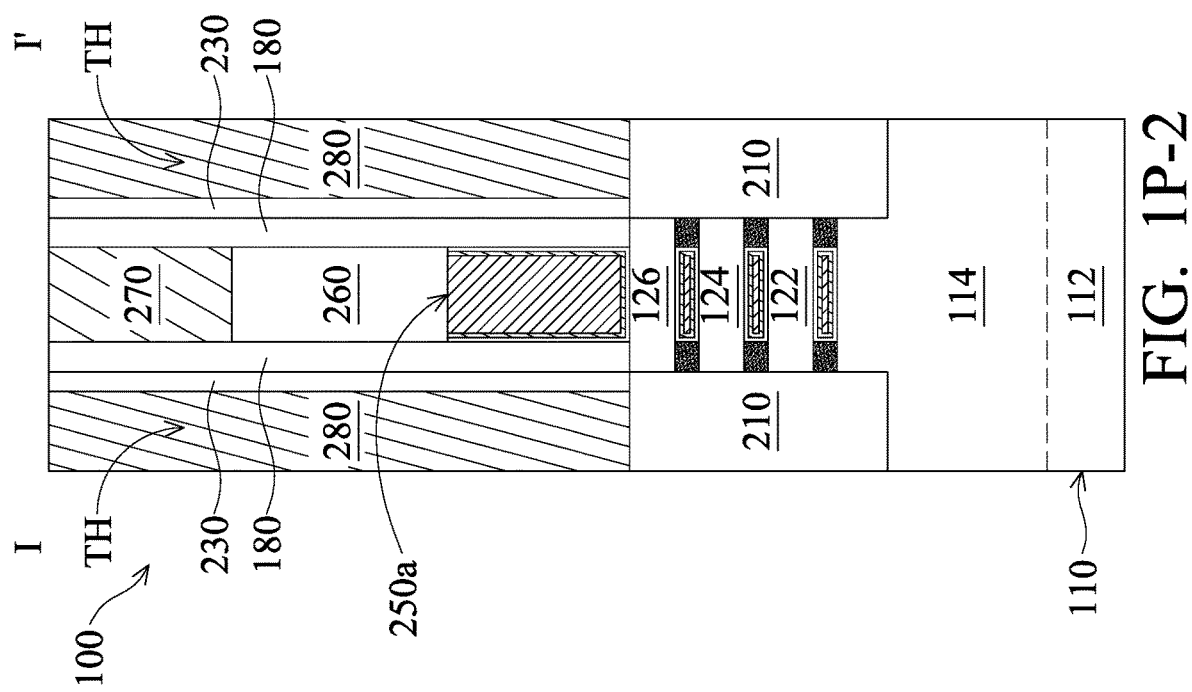

FIG. 1P-1 is a perspective view of a portion A of the semiconductor device structure of FIG. 1P, in accordance with some embodiments. FIG. 1P-2 is a cross-sectional view illustrating the semiconductor device structure along a sectional line I-I' in FIG. 1P, in accordance with some embodiments.

As shown in FIGS. 1P, 1P-1 and 1P-2, portions of the gate stack structure 250 are removed to form trenches 250t in the gate stack structure 250, in accordance with some embodiments. The gate stack structure 250 is divided into gate stacks 250a, in accordance with some embodiments. Each gate stack 250a is over the isolation layer 150 and wrapped around the nanostructures 122, 124 and 126, in accordance with some embodiments. The gate stack 250a and the corresponding source/drain structures 210 and/or 220 together form a transistor TR, in accordance with some embodiments. The transistor TR is also referred to as a forksheet transistor, in accordance with some embodiments.

The air gap 168 of the isolation structure 160 is between the gate stacks 250a, in accordance with some embodiments. The air gap 168 of the isolation structure 160 is between the adjacent fins 114 and between the adjacent nanostructure stacks 120, in accordance with some embodiments.

The insulating layer 130 is between the isolation structure 160 and the substrate 110, in accordance with some embodiments. The insulating layer 130 is between the isolation structure 160 and the nanostructures 122, 124 and 126, in accordance with some embodiments.

The insulating layer 130 is between the isolation structure 160 and the gate stacks 250a, in accordance with some embodiments. The insulating layer 130 separates the isolation structure 160 from the gate stacks 250a, the substrate 110, and the nanostructures 122, 124 and 126, in accordance with some embodiments.

As shown in FIGS. 1P, 1P-1 and 1P-2, a dielectric layer 260 is formed in the trench 181 of the spacer structure 180 and over the gate stacks 250a, in accordance with some embodiments. The dielectric layer 260 is filled into the trenches 250t, in accordance with some embodiments. The dielectric layer 260 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 260 is formed by a deposition process (e.g., a chemical vapor deposition process), in accordance with some embodiments.

As shown in FIGS. 1P, 1P-1 and 1P-2, a portion of the dielectric layer 260 is removed to form a through hole 262 in the dielectric layer 260, in accordance with some embodiments. The removal process includes a photolithography process and an etching process, in accordance with some embodiments.

As shown in FIGS. 1P, 1P-1 and 1P-2, a wiring structure 270 is formed in the trench 181 of the spacer structure 180 and over the dielectric layer 260, in accordance with some embodiments. The wiring structure 270 is filled into the through hole 262, in accordance with some embodiments. The wiring structure 270 is electrically connected to the gate stack 250a, in accordance with some embodiments. The wiring structure 270 is made of Cu, W, Co, Al, or another suitable conductive material.

As shown in FIGS. 1P, 1P-1, and 1P-2, portions of the etch stop layer 230 and the dielectric layer 240 are removed to form through holes TH in the etch stop layer 230 and the dielectric layer 240, in accordance with some embodiments. The through holes TH expose the source/drain structures 210 and 220, in accordance with some embodiments.

As shown in FIGS. 1P, 1P-1, and 1P-2, contact structures 280 are formed in the through holes TH, in accordance with some embodiments. The contact structures 280 are electrically connected to the source/drain structures 210 and 220, in accordance with some embodiments. The contact structures 280 are made of Cu, W, Co, Al, or another suitable conductive material. In this step, a semiconductor device structure 100 is substantially formed, in accordance with some embodiments.

The methods (for forming the semiconductor device structure) form the air gap 168 in the isolation structure 160 between two adjacent source/drain structures 210 or 220 to reduce the parasitic capacitance between the two adjacent source/drain structures 210 or 220, in accordance with some embodiments. Therefore, the AC (alternating-current) performance of the semiconductor device structure 100 is improved, in accordance with some embodiments.

Figure 2A:
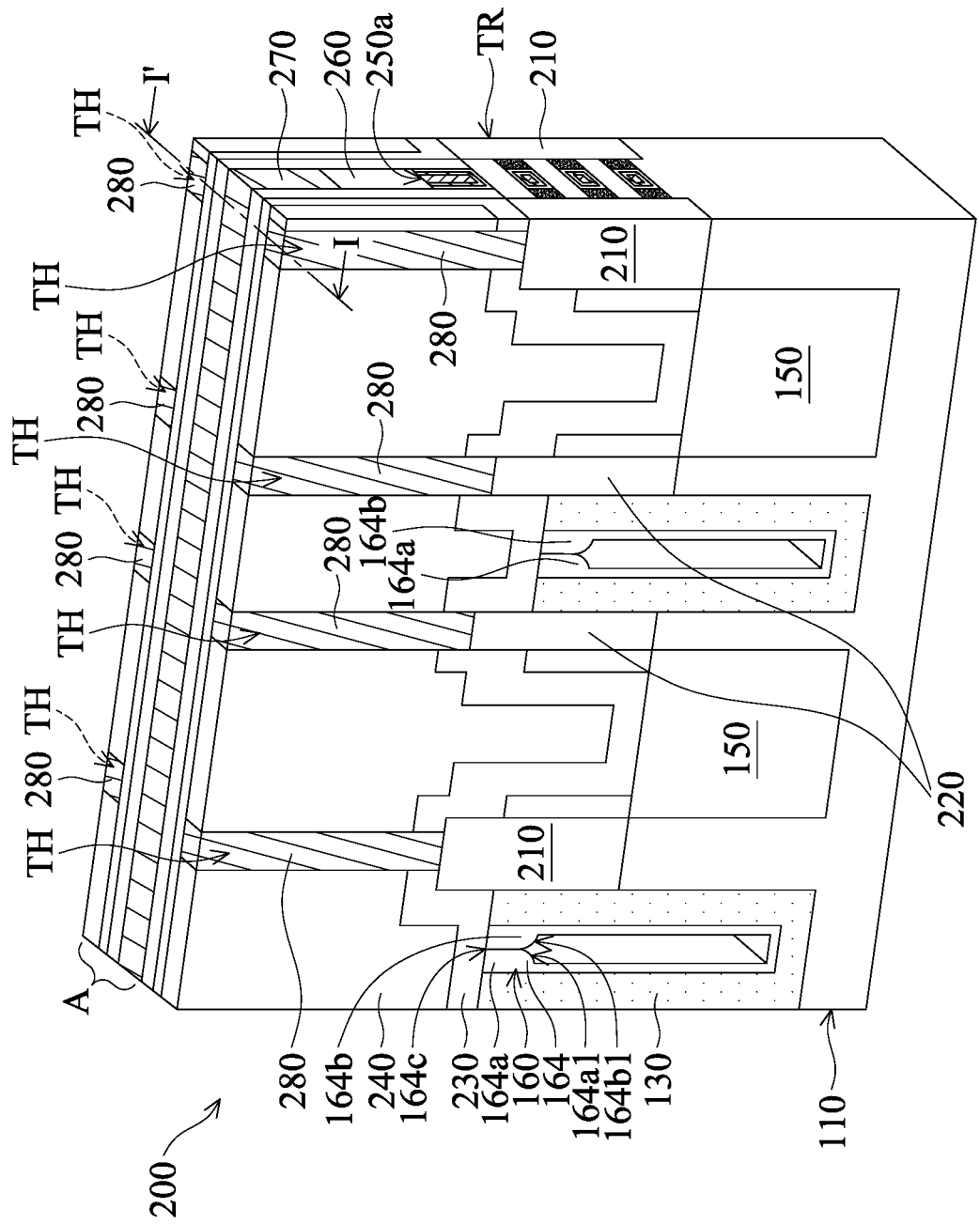
FIG. 2A is a perspective view of a semiconductor device structure, in accordance with some embodiments.
Figure 2B:
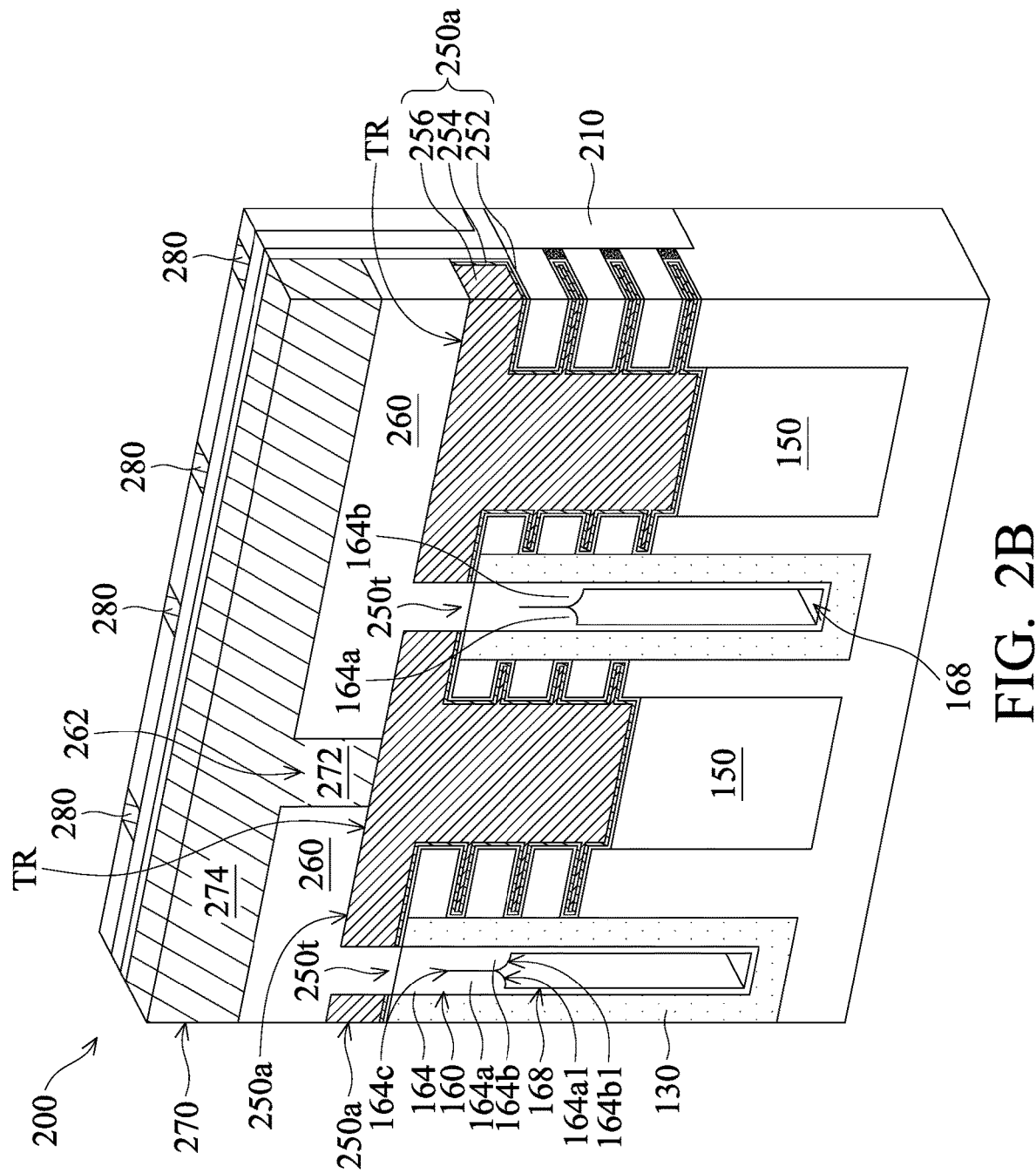
FIG. 2B is a perspective view of a portion of the semiconductor device structure of FIG. 2A, in accordance with some embodiments.

FIG. 2A is a perspective view of a semiconductor device structure, in accordance with some embodiments. FIG. 2B is a perspective view of a portion A of the semiconductor device structure of FIG. 2A, in accordance with some embodiments.

As shown in FIGS. 2A and 2B, the semiconductor device structure 200 is similar to the semiconductor device structure 100 of FIG. 1P, except that the shape of the middle part 164 of the isolation structure 160 of FIG. 2A is different from that of the isolation structure 160 of FIG. 1P, in accordance with some embodiments. The portion 164a of the middle part 164 has a curved bottom surface 164a1, in accordance with some embodiments. The portion 164b of the middle part 164 has a curved bottom surface 164b1, in accordance with some embodiments.

Processes and materials for forming the semiconductor device structure 200 may be similar to, or the same as, those for forming the semiconductor device structure 100 described above. Elements designated by the same or similar reference numbers as those in FIGS. 1A to 2B have the same or similar structures and the materials. Therefore, the detailed descriptions thereof will not be repeated herein.

In accordance with some embodiments, semiconductor device structures and methods for forming the same are provided. The methods (for forming the semiconductor device structure) form an air gap in an isolation structure between two adjacent source/drain structures to reduce the parasitic capacitance between the two adjacent source/drain structures. Therefore, the AC performance of the semiconductor device structures is improved.

In accordance with some embodiments, a method for forming a semiconductor device structure is provided. The method includes providing a substrate having a base, a first fin, and a second fin over the base. The method includes forming a first nanostructure stack and a second nanostructure stack over the first fin and the second fin respectively. The first nanostructure stack comprises a first nanostructure and a second nanostructure sequentially formed over the first fin, and the second nanostructure stack comprises a third nanostructure and a fourth nanostructure sequentially formed over the second fin. The method includes forming an isolation layer over the base. The isolation layer has a first portion and a second portion, and the first fin and the second fin are between the first portion and the second portion. The method includes forming an isolation structure between the first fin and the second fin and between the first nanostructure stack and the second nanostructure stack. The isolation structure has an air gap. The method includes partially removing the isolation layer. The method includes forming a gate stack over the first nanostructure stack, the second nanostructure stack, the isolation structure, and the isolation layer.

In accordance with some embodiments, a method for forming a semiconductor device structure is provided. The method includes providing a substrate having a base, a first fin, and a second fin over the base. The method includes forming a first nanostructure stack and a second nanostructure stack over the first fin and the second fin respectively, wherein a gap is between the first fin and the second fin and between the first nanostructure stack and the second nanostructure stack. The method includes forming an insulating layer in the gap. The insulating layer has a trench. The method includes forming a sacrificial layer in the trench. The method includes forming an isolation layer over the base. The isolation layer has a first portion and a second portion, and the first fin, the second fin, the insulating layer, and the sacrificial layer are between the first portion and the second portion. The method includes removing the sacrificial layer. The method includes forming an isolation structure in the trench of the insulating layer. The isolation structure has an air gap. The method includes partially removing the isolation layer. The method includes forming a gate stack over the first nanostructure stack, the second nanostructure stack, the isolation structure, the insulating layer, and the isolation layer.

In accordance with some embodiments, a semiconductor device structure is provided. The semiconductor device structure includes a substrate having a base, a first fin, and a second fin over the base. The semiconductor device structure includes a first nanostructure and a second nanostructure over the first fin and the second fin respectively. The semiconductor device structure includes an isolation structure between the first fin and the second fin and between the first nanostructure and the second nanostructure. The isolation structure has an air gap. The semiconductor device structure includes an isolation layer over the base. The isolation layer has a first portion and a second portion, and the first fin, the second fin, and the isolation structure are between the first portion and the second portion. The semiconductor device structure includes a first gate stack over the isolation layer and wrapped around the first nano structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a substrate having a base, a first fin, and a second fin over the base;
   forming a first nanostructure stack and a second nanostructure stack over the first fin and the second fin respectively, wherein the first nanostructure stack comprises a first nanostructure and a second nanostructure sequentially formed over the first fin, and the second nanostructure stack comprises a third nanostructure and a fourth nanostructure sequentially formed over the second fin;
   forming an isolation layer over the base, wherein the isolation layer has a first portion and a second portion, and the first fin and the second fin are between the first portion and the second portion;
   forming an isolation structure between the first fin and the second fin and between the first nanostructure stack and the second nanostructure stack, wherein the isolation structure has an air gap, the isolation structure over the air gap has a third portion and a fourth portion, and there is a boundary between the third portion and the fourth portion;
   partially removing the isolation layer; and
   forming a gate stack over the first nanostructure stack, the second nanostructure stack, the isolation structure, and the isolation layer.

2. The method for forming the semiconductor device structure as claimed in claim 1, further comprising:
   forming an insulating layer between the first fin and the second fin and between the first nanostructure stack and the second nanostructure stack before forming the isolation structure between the first fin and the second fin and between the first nanostructure stack and the second nanostructure stack, wherein the isolation structure is formed over the insulating layer.

3. The method for forming the semiconductor device structure as claimed in claim 2, wherein the insulating layer has a trench between the first fin and the second fin and between the first nanostructure stack and the second nanostructure stack, and the isolation structure is formed in the trench.

4. The method for forming the semiconductor device structure as claimed in claim 3, wherein the air gap of the isolation structure is in the trench.

5. The method for forming the semiconductor device structure as claimed in claim 2, wherein the insulating layer is between the air gap of the isolation structure and the first fin.

6. The method for forming the semiconductor device structure as claimed in claim 2, wherein the insulating layer is between the air gap of the isolation structure and the first nanostructure stack.

7. The method for forming the semiconductor device structure as claimed in claim 2, wherein a first top surface of the isolation structure and a second top surface of the insulating layer are substantially level with each other and higher than a third top surface of the isolation layer after the isolation layer is partially removed.

8. The method for forming the semiconductor device structure as claimed in claim 1, wherein the boundary extends away from the base of the substrate.

9. The method for forming the semiconductor device structure as claimed in claim 1, wherein the boundary is between the first nanostructure stack and the second nanostructure stack.

10. The method for forming the semiconductor device structure as claimed in claim 1, wherein a length of the air gap is greater than a width of the air gap, the length is in a first direction perpendicular to a top surface of the base, and the width is in a second direction perpendicular to a sidewall of the first fin.

11. A method for forming a semiconductor device structure, comprising:
providing a substrate having a base, a first fin, and a second fin over the base;
forming a first nanostructure stack and a second nanostructure stack over the first fin and the second fin respectively, wherein a gap is between the first fin and the second fin and between the first nanostructure stack and the second nanostructure stack;
forming an insulating layer in the gap, wherein the insulating layer has a trench;
forming a sacrificial layer in the trench;
forming an isolation layer over the base, wherein the isolation layer has a first portion and a second portion, and the first fin, the second fin, the insulating layer, and the sacrificial layer are between the first portion and the second portion;
removing the sacrificial layer;
after removing the sacrificial layer, forming an isolation structure in the trench of the insulating layer, wherein the isolation structure has an air gap;
partially removing the isolation layer; and
forming a gate stack over the first nanostructure stack, the second nanostructure stack, the isolation structure, the insulating layer, and the isolation layer.

12. The method for forming the semiconductor device structure as claimed in claim 11, wherein the forming of the insulating layer in the gap and the forming of the sacrificial layer in the trench comprise:
depositing an insulating material layer over the first nanostructure stack, the second nanostructure stack, and the substrate;
depositing a sacrificial material layer over the insulating material layer; and
removing the insulating material layer and the sacrificial material layer outside of the gap, wherein the insulating material layer remaining in the gap forms the insulating layer, and the sacrificial material layer remaining in the gap forms the sacrificial layer.

13. The method for forming the semiconductor device structure as claimed in claim 11, wherein the trench of the insulating layer is filled up by the sacrificial layer.

14. The method for forming the semiconductor device structure as claimed in claim 11, wherein the forming of the isolation structure in the trench of the insulating layer comprises:
depositing an isolation material layer over the first nanostructure stack, the second nanostructure stack, the insulating layer, and the isolation layer and in the trench; and
removing the isolation material layer outside of the trench, wherein the isolation material layer remaining in the trench forms the isolation structure.

15. The method for forming the semiconductor device structure as claimed in claim 11, wherein the trench of the insulating layer has a trench bottom surface facing away from the base, the sacrificial layer has a first bottom surface facing the base and substantially level with the trench bottom surface, and the isolation structure has a second bottom surface facing the base and substantially level with the trench bottom surface.

16. A method for forming a semiconductor device structure, comprising:
providing a substrate having a base, a first fin, and a second fin over the base;
forming a first nanostructure stack and a second nanostructure stack over the first fin and the second fin respectively, wherein the first nanostructure stack comprises a first nanostructure and a second nanostructure, and the first nanostructure is between the first fin and the second nanostructure;
forming an isolation layer over the base, wherein the isolation layer has a first portion and a second portion, and the first fin and the second fin are between the first portion and the second portion;
forming an isolation structure between the first fin and the second fin and between the first nanostructure stack and the second nanostructure stack, wherein the isolation structure has an air gap, and a top portion of the air gap is higher than a first top surface of the first fin;
partially removing the isolation layer, wherein the top portion of the air gap is higher than a second top surface of the second nanostructure after the isolation layer is partially removed; and
forming a gate stack over the first nanostructure stack, the second nanostructure stack, the isolation structure, and the isolation layer.

17. The method for forming the semiconductor device structure as claimed in claim 16, wherein the top portion of the air gap is higher than a third top surface of the second fin.

18. The method for forming the semiconductor device structure as claimed in claim 16, further comprising:
partially removing the first nanostructure stack and the second nanostructure stack, which are not covered by the gate stack; and
forming a first source/drain structure and a second source/drain structure connected to the first nanostructure stack and the second nanostructure stack respectively.

19. The method for forming the semiconductor device structure as claimed in claim 18, wherein the top portion of the air gap is between the first source/drain structure and the second source/drain structure.

20. The method for forming the semiconductor device structure as claimed in claim 18, wherein the partially removing of the first nanostructure stack and the second nanostructure stack, which are not covered by the gate stack, further comprises:
partially removing the isolation structure, which are not covered by the gate stack, wherein the isolation structure has a third top surface and an upper surface facing away from the base, the third top surface is covered by the gate stack, the upper surface is not covered by the gate stack, and the third top surface is higher than the upper surface.

* * * * *